United States Patent
Yan et al.

(10) Patent No.: US 9,720,609 B1
(45) Date of Patent: Aug. 1, 2017

(54) DATA PROTECTING METHOD, MEMORY CONTROL CIRCUIT UNIT AND MEMORY STORAGE DEVICE

(71) Applicant: PHISON ELECTRONICS CORP., Miaoli (TW)

(72) Inventors: Horng-Sheng Yan, Penghu County (TW); Kok-Yong Tan, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/147,914

(22) Filed: May 6, 2016

(30) Foreign Application Priority Data

Mar. 22, 2016 (TW) .............................. 105108736 A

(51) Int. Cl.
*G06F 12/00* (2006.01)
*G06F 3/06* (2006.01)

(52) U.S. Cl.
CPC .......... *G06F 3/0619* (2013.01); *G06F 3/0655* (2013.01); *G06F 3/0688* (2013.01)

(58) Field of Classification Search
CPC .............................. G06F 3/0619; G06F 3/0688
USPC ........................................................ 711/103
See application file for complete search history.

(56) References Cited

U.S. PATENT DOCUMENTS

| 8,397,127 B2* | 3/2013 | Otsuka ................ G06F 11/1072 711/103 |
| 9,021,343 B1* | 4/2015 | Hu ....................... G11C 29/785 365/185.03 |
| 9,230,684 B2* | 1/2016 | Yao ......................... G11C 29/04 |
| 2014/0149826 A1* | 5/2014 | Lu .......................... G06F 11/108 714/764 |
| 2016/0283319 A1* | 9/2016 | Chou .................. G06F 11/1072 |

* cited by examiner

*Primary Examiner* — Pierre-Michel Bataille
(74) *Attorney, Agent, or Firm* — Jianq Chyun IP Office

(57) ABSTRACT

A data protecting method for a rewritable non-volatile memory module is provided. The method includes assigning a plurality of physical pages into a plurality of encoding groups to group a first physical page to a first encoding group and group a second physical page to a second encoding group, where each of the physical pages stores user data and a parity code corresponding to the user data, the first physical page is composed of memory cells of a first word line, and the second physical page is composed of memory cells of a second word line adjacent to the first word line. The method also includes respectively encoding the user data in the physical pages of the encoding groups for generating a plurality of group parity codes respectively corresponding to the encoding groups.

29 Claims, 11 Drawing Sheets

| Lower physical programming unit | Upper physical programming unit | |
|---|---|---|
| 0 | 1 | → WL0 |
| 2 | 3 | → WL1 |
| ⋮ | ⋮ | |
| 254 | 255 | → WL127 |

DATA PROTECTING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 105108736, filed on Mar. 22, 2016. The entirety of the above-mentioned patent application is hereby incorporated by reference herein and made a part of this specification.

BACKGROUND

1. Technology Field

The present invention relates to a data protecting method for a rewritable non-volatile memory module, and a memory control circuit unit and a memory storage device using the same.

2. Description of Related Art

The markets of digital cameras, cellular phones, and MP3 players have expanded rapidly in recent years, resulting in escalated demand for storage media by consumers. Due to having characteristics, such as data non-volatility, low power consumption, compact size and no mechanical structure, a rewritable non-volatile memory module (e.g., a flash memory) is suitable for being built in the aforementioned portable multi-media devices listed for example.

A rewritable non-volatile memory module typically includes a plurality of word lines and a plurality of bit lines, and a memory cell is disposed on an intersection of each word line and each bit line. Each memory cell can store data of one or more bits, and the memory cells arranged on the same word line constitute one or more physical pages. The data stored in the rewritable non-volatile memory module is generally protected using a physical page as a unit. For example, when user data is written into a physical page, an error correction code (ECC) generated correspondingly to the user data is also written into the same physical page. However, during the process of programming, programming a physical page may affect data stored in the other physical pages on the same word line or an adjacent word line. Accordingly, how to provide the stored data with more protection has become a goal to be achieved for technicians of the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a memory management method, a memory control circuit unit and a memory storage device capable of improving protection capability of data stored in physical pages.

According to an exemplary embodiment, a data protecting method for a rewritable non-volatile memory module is provided. The rewritable non-volatile memory module includes a plurality of word lines, and memory cells on the same word line constitute at least one physical page. The method includes assigning a plurality of physical pages into a plurality of encoding groups. Herein, the step of assigning the physical pages into the encoding groups includes grouping a first physical page among the physical pages to a first encoding group among the encoding groups, and grouping a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line. The method also includes storing user data and a parity code corresponding to the user data in each of the physical pages, and respectively encoding the user data in the physical pages of the encoding groups to generate a plurality of group parity codes respectively corresponding to the encoding groups. The method further includes correcting the user data stored in the first physical page by using the group parity code corresponding to the first encoding group if the user data stored in the first physical page fails to be corrected according to the parity code stored in the first physical page.

According to an exemplary embodiment, a data protecting method for a rewritable non-volatile memory module is provided. The rewritable non-volatile memory module includes a plurality of word lines, and memory cells on the same word line constitute at least two physical pages. The method includes assigning a plurality of physical pages into a plurality of encoding groups. Herein, the step of assigning the physical pages into the encoding groups includes grouping a first physical page among the physical pages to a first encoding group among the encoding groups, and grouping another physical page among the physical pages to a second encoding group among the encoding groups, wherein the first physical page and the another physical page are composed of memory cells connected to a first word line among the word lines. The method also includes storing user data and a parity code corresponding to the user data in each of the physical pages, and respectively encoding the user data in the physical pages of the encoding groups to generate a plurality of group parity codes respectively corresponding to the encoding groups. The method further includes correcting the user data stored in the first physical page by using the group parity code corresponding to the first encoding group if the user data stored in the first physical page fails to be corrected according to the parity code stored in the first physical page.

According to an exemplary embodiment, a data protecting method for a rewritable non-volatile memory module is provided. The rewritable non-volatile memory module includes a plurality of word lines, and memory cells on the same word line constitute at least one physical page. The method includes assigning a plurality of physical pages into a plurality of encoding groups. Herein, the step of assigning the physical pages into the encoding groups includes grouping a first physical page among the physical pages to a first encoding group among the encoding groups, and grouping a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line. The method also includes respectively encoding the user data in the physical pages of the encoding groups to generate a plurality of group parity codes respectively corresponding to the encoding groups. The method further includes correcting data stored in the physical page belonging to the first encoding group by using the group parity code corresponding to the first encoding group, and correcting the data stored in the physical page belonging to the second encoding group by using the group parity code corresponding to the second encoding group.

According to an exemplary embodiment, a memory control circuit unit for controlling a rewritable non-volatile memory module is provided. The rewritable non-volatile memory module includes a plurality of word lines, and memory cells on the same word line constitute at least one physical page. The memory controller includes a host interface, a memory interface, an error checking and correcting circuit and a memory management circuit. The host interface is configured to couple to a host system. The memory interface is configured to couple to the rewritable non-volatile memory module. The memory management circuit is coupled to the host interface, the error checking and correcting circuit and the memory interface. The memory management circuit assigns a plurality of physical pages into a plurality of encoding groups. In the operation of assigning the physical pages into the encoding groups, the memory management circuit groups a first physical page among the physical pages to a first encoding group among the encoding groups, and groups a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line. In addition, the memory management circuit stores a user data and a parity code corresponding to the user data in each of the physical pages. The error checking and correcting circuit respectively encodes the user data in the physical pages of the encoding groups to generate a plurality of group parity codes respectively corresponding to the encoding groups. Besides, the error checking and correcting circuit corrects the user data stored in the first physical page by using the group parity code corresponding to the first encoding group if the user data stored in the first physical page fails to be corrected according to the parity code stored in the first physical page.

According to an exemplary embodiment, a memory storage device including a connection interface unit, a rewritable non-volatile memory module and a memory control circuit unit is provided. The connection interface unit is coupled to a host system. The rewritable non-volatile memory module includes a plurality of word lines, and memory cells on the same word line constitute at least one physical page. The memory control circuit unit is coupled to the connection interface unit and the rewritable non-volatile memory module. The memory control circuit unit assigns a plurality of physical pages into a plurality of encoding groups. In the operation of assigning the physical pages into the encoding groups, the memory control circuit unit groups a first physical page among the physical pages to a first encoding group among the encoding groups, and groups a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line. In addition, the memory control circuit unit stores user data and a parity code corresponding to the user data in each of the physical pages, and respectively encodes the user data in the physical pages of the encoding groups to generate a plurality of group parity codes respectively corresponding to the encoding groups. Besides, the memory control circuit unit corrects the user data stored in the first physical page by using the group parity code corresponding to the first encoding group if the user data stored in the first physical page fails to be corrected according to the parity code stored in the first physical page.

To sum up, in the memory management method, the memory control circuit unit and the memory storage device provided by the present invention, a plurality of physical pages can be assigned into a plurality of encoding groups according to the word line, the plane or the channel corresponding to each physical page, such that the data stored in the plurality of physical pages grouped to the same encoding group are encoded again to further generate the group parity code. In this way, the data stored in the rewritable non-volatile memory module can be performed with an error checking and correcting operation not only according to the parity code store in each physical page, but also according to the further generated group parity code, such that the protection of the data stored in physical pages can be improved.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, embodiments accompanied with drawings are described in detail below.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention.

DESCRIPTION OF EMBODIMENTS

Figure 1:
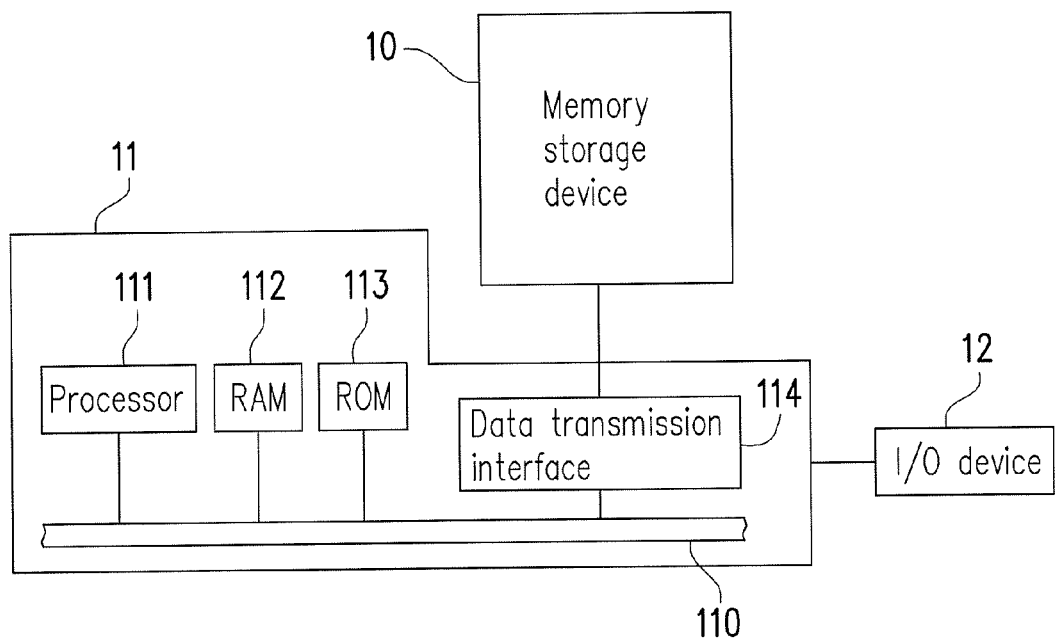
FIG. 1 is a schematic diagram illustrating a host system, a memory storage device and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e. a memory storage system) includes a rewritable non-volatile memory module and a controller (i.e. a control circuit unit). The memory storage device is usually used together with a host system, such that the host system can write data into or read data from the memory storage device.

Figure 2:
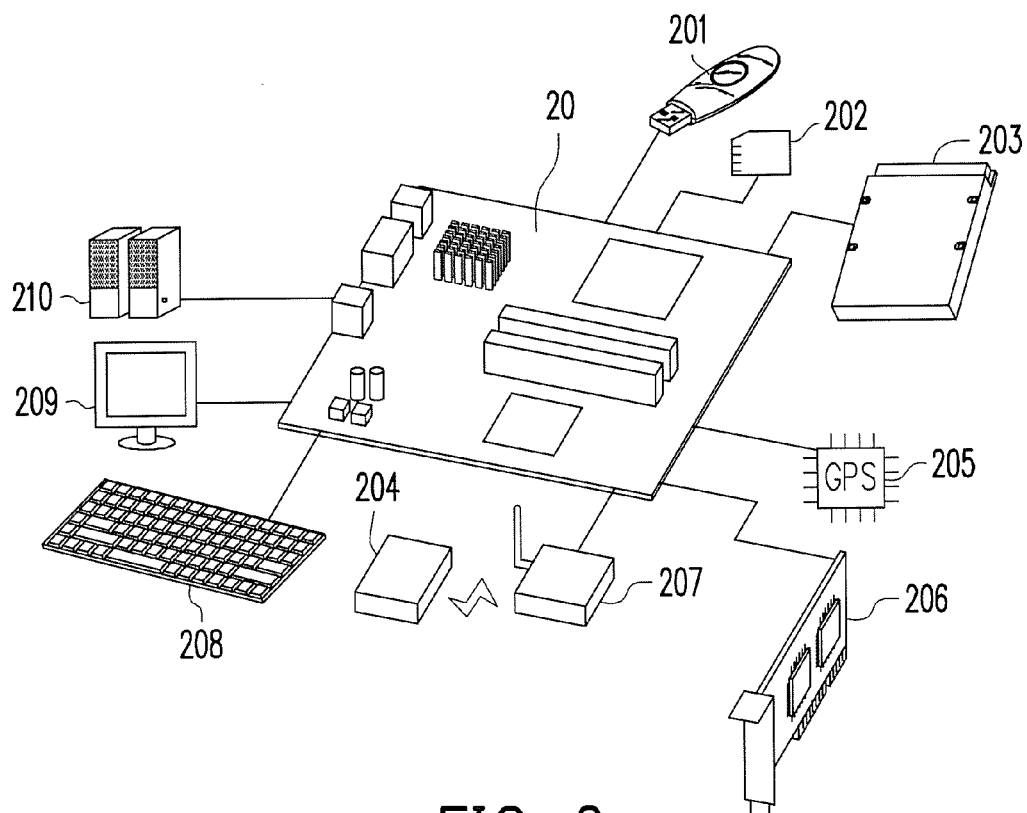
FIG. 2 is a schematic diagram illustrating a host system, a memory storage device and an I/O device according to another exemplary embodiment.

FIG. 1 is a schematic diagram illustrating a host system, a memory storage device and an input/output (I/O) device according to an exemplary embodiment, and FIG. 2 is a schematic diagram illustrating a host system, a memory storage device and an I/O device according to another exemplary embodiment of the present invention.

Referring to FIG. 1 and FIG. 2, a host 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For instance, the host system 11 may write data into or read data from the memory storage device 10 through the data transmission interface 114. Additionally, the host system 11 is coupled to an I/O device 12 through the system bus 110. For example, the host system 11 may transmit an output signal to or receive an input signal from the I/O device 12 through the system bus 110.

In the present exemplary embodiment, the processor 111, the RAM 112, the ROM 113 and the data transmission interface 114 may be disposed on a mainboard 20 of the host system 11. The number of the data transmission interface 114 may be one or a plurality. The mainboard 20 may be coupled to the memory storage device 10 in a wired or a wireless manner through the data transmission interface 114. The memory storage device 10 may be a flash drive 201, a memory card 202, or a solid state drive (SSD) 203 or a wireless memory storage device 204. The wireless memory storage device 204 may be, for example, a memory storage device based on a variety of wireless communication techniques, such as a near field communication (NFC) memory storage device, a WiFi memory storage device, a Bluetooth memory storage device or a low energy (LE) Bluetooth memory storage device (e.g., iBeacon). Additionally, the mainboard 20 may also be coupled to various I/O devices, such as a global positioning system (GPS) module 205, a network interface card 206, a wireless transmission device 207, a keyboard 208, a monitor 209, and a speaker 210 through the system bus 110. For instance, in an exemplary embodiment, the mainboard 20 may access the wireless memory storage device 204 through the wireless transmission device 207.

Figure 3:
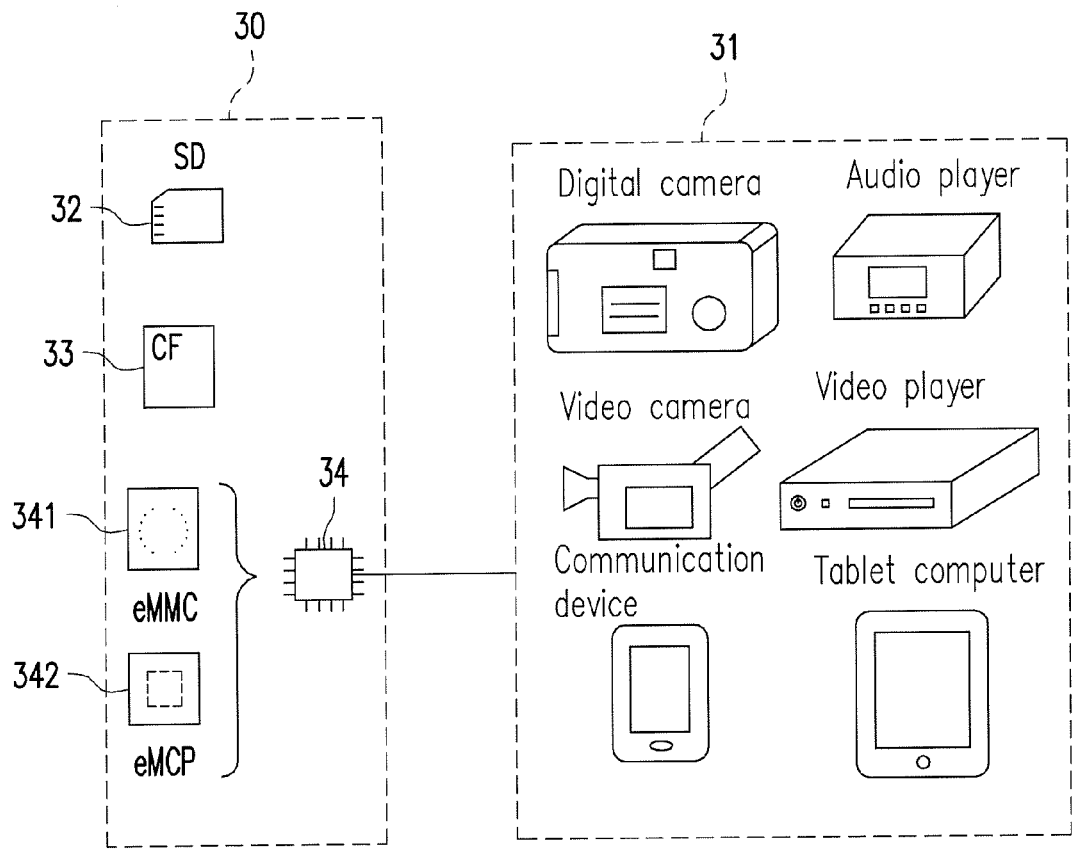
FIG. 3 is a schematic diagram illustrating a host system and a memory storage device according to another exemplary embodiment.

In an exemplary embodiment, the aforementioned host system can substantially be any system collocated with the memory storage device for storing data. In the exemplary embodiments above, the host system is illustrated as a computer system for description; however, FIG. 3 is a schematic diagram illustrating a host system and a memory storage device according to another exemplary embodiment. Referring to FIG. 3, in another exemplary embodiment, a host system 31 may also be a system, such as a digital camera, a video camera, a communication device, an audio player, a video player or a tablet computer, and a memory storage device 30 may be a non-volatile memory storage device used thereby, such as an SD card 32, a CF card 33 or an embedded storage device 34. The embedded storage device 34 may include an embedded MMC (eMMC) 341 and/or an embedded multi chip package (eMCP) 342, in which a memory module is directly coupled to a substrate of the host system.

Figure 4:
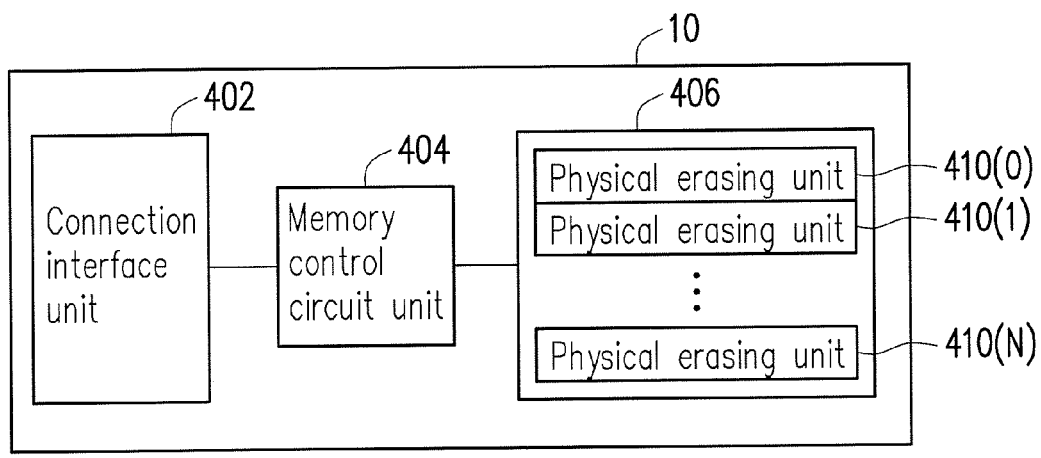
FIG. 4 is a schematic block diagram of the memory storage device according to an exemplary embodiment.

FIG. 4 is a schematic block diagram of the memory storage device according to an exemplary embodiment.

Referring to FIG. 4, the memory storage device 10 includes a connection interface unit 402, a memory control circuit unit 404, and a rewritable non-volatile memory module 406.

In the present exemplary embodiment, the connection interface unit 402 complies with a serial advanced technology attachment (SATA) standard. However, it should be understood that the present invention is not limited thereto, and the connection interface unit 402 may also comply with a parallel advanced technology attachment (PATA) standard, an institute of electrical and electronic engineers (IEEE) 1394 standard, a peripheral component interconnect express (PCI Express) standard, a universal serial bus (USB) standard, an ultra high speed-I (UHS-I) interface standard, an ultra high speed-II (UHS-II) interface standard, a secure digital (SD) interface standard, a memory stick (MS) interface standard, a multi-chip package interface standard, a multi media card (MMC) interface standard, an embedded multimedia card (eMMC) interface standard, a universal flash storage (UFS) interface standard, an embedded multi-chip package (eMCP) interface standard, a compact flash (CF) interface standard, an integrated device electronics (IDE) standard, or other suitable standards. In the present exemplary embodiment, the connection interface unit 402 may be packaged with the memory control circuit unit 404 in one chip or laid outside a chip including the memory control circuit unit.

The memory control circuit unit 404 is configured to execute a plurality of logic gates or control commands which are implemented in a hardware form or a firmware form and perform operations such as data writing, data reading or data erasing in the rewritable non-volatile memory module 406 according to the commands of the host system 11.

The rewritable non-volatile memory module 406 is coupled to the memory control circuit unit 404 and configured to store data written by the host system 11. The rewritable non-volatile memory module 406 includes a plurality of physical erasing units 410(0)-410(N). Each of the physical erasing units includes a plurality of physical programming units, and the physical programming units belonging to the same physical erasing unit may be written separately but erased altogether at the same time. However, it should be understood that the present invention is not limited thereto, and each of the physical erasing units may be composed of 64, 256 or any other number of physical programming units.

In detail, a physical erasing unit is the smallest unit for erasing. Namely, each physical erasing unit has the least number of memory cells to be erased altogether. A physical programming unit is the smallest unit for programming. Namely, the physical programming unit is the smallest unit for writing data. Each of the physical programming units generally includes a data bit area and a redundant bit area. The data bit area includes a plurality of physical access addresses for storing user data, and the redundant bit area is configured to store system data (e.g., control information and error correcting codes). In the present exemplary embodiment, the data bit area of each physical programming unit contains 8 physical access addresses, and the size of each physical access address is 512 bytes. However, in other exemplary embodiments, the data bit area may contain more or less number of physical access addresses, and the number and the size of the physical access addresses are not limited in the present invention. For instance, in an exemplary embodiment, the physical erasing units are physical blocks, and the physical programming units are physical pages or physical sectors, which are not limited in the present invention.

In the present exemplary embodiment, the rewritable non-volatile memory module 406 is a multi level cell (MLC) NAND flash memory module (i.e., a flash memory module capable of storing data of 2 bits in one memory cell). However, the invention is not limited thereto, and the rewritable non-volatile memory module 406 may also be a single-level cell (SLC) NAND flash memory module (i.e., a flash memory module capable of storing data of 1 bit in one memory cell), a trinary-level cell (TLC) NAND flash memory module (i.e., a flash memory module capable of storing data of 3 bits in one memory cell), any other flash memory module, or any other memory module with the same characteristics.

Figures 5A, 5B:
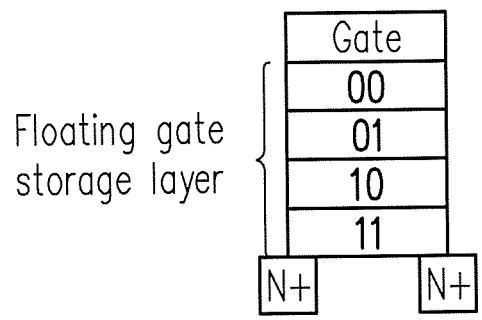
FIG. 5A and FIG. 5B are schematic diagrams illustrating examples of the memory cell storage structure and the physical erasing unit according to an exemplary embodiment of the present invention.

FIG. 5A and FIG. 5B are schematic diagrams illustrating examples of the memory cell storage structure and the physical erasing unit according to an exemplary embodiment of the present invention. In the present exemplary embodiment, an MLC NAND flash memory is illustrated as an example for description.

Referring to FIG. 5, each of the memory cells in the rewritable non-volatile memory module 406 is capable of storing data of 2 bits, and a storage state of each memory cell may be identified as "11", "10", "01" or "00", each storage state includes the least significant bit (LSB) and the most significant bit (MSB). For instance, a value of a first bit from the left is the LSB, and a value of a second bit from the left is the MSB. Thus, memory cells connected to the same word line may constitute two physical pages, in which the physical page composed of the LSBs of the memory cells is referred to as a lower physical page, and the physical page composed of the MSBs of the memory cells is referred to as an upper physical page.

Referring to FIG. 5B, a physical erasing unit is composed of a plurality of physical page groups, and each physical page group includes the lower physical page and the upper physical page constituted by the memory cells arranged on the same word line. For instance, in the physical erasing unit, the $0^{th}$ physical page belonging to the lower physical page and the $1^{st}$ physical page belonging to upper physical page are constituted by the memory cells arranged on a word line WL0 and thus, considered as one physical page group. Similarly, the $2^{nd}$ and the $3^{rd}$ physical pages are constituted by the memory cells arranged on a word line WL1 and thus, considered as one physical page group, and the other physical pages are grouped to a plurality of physical page groups in the same way.

Figure 6:
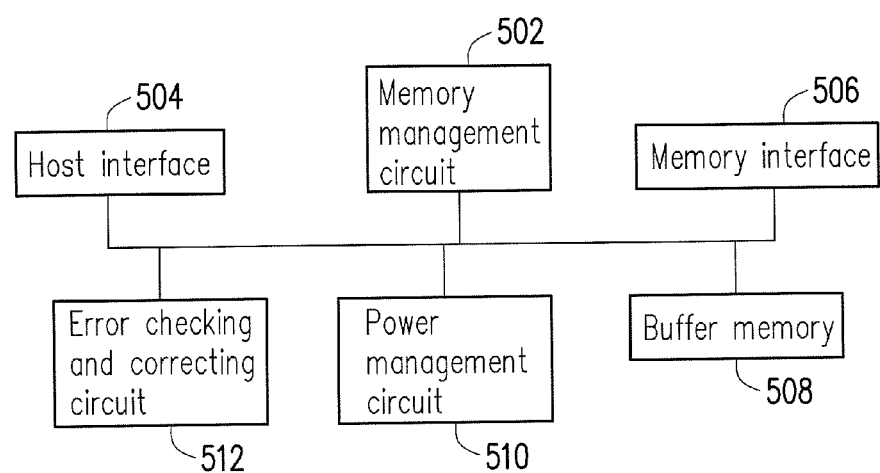
FIG. 6 is a schematic block diagram illustrating the memory control circuit unit according to an exemplary embodiment.

FIG. 6 is a schematic block diagram illustrating the memory control circuit unit according to an exemplary embodiment.

Referring to FIG. 6, the memory control circuit unit 404 includes a memory management circuit 502, a host interface 504, a memory interface 506, a buffer memory 508, a power management circuit 510, and an error checking and correcting circuit 512.

The memory management circuit 502 is configured to control the overall operation of the memory control circuit unit 404. Specifically, the memory management circuit 502 has a plurality of control instructions, and when the memory storage apparatus 10 is in operation, the control instructions are executed to perform operations, such as data writing, data reading, and data erasing.

In the present exemplary embodiment, the control instructions of the memory management circuit 502 are implemented in a firmware form. For example, the memory management circuit 502 has a microprocessor unit (not shown) and a read-only memory (ROM, not shown), and the control instructions are burnt in the ROM. When the memory storage device 10 is in operation, the control commands are executed by the microprocessor unit to perform data operations, such as data writing, data reading and data erasing.

In another exemplary embodiment, the control commands of the memory management circuit 502 may also be stored as program codes in a specific area (e.g., a system area in the memory module exclusively used for storing system data) of the rewritable non-volatile memory module 406. Moreover, the memory management circuit 502 has a microprocessor unit (not shown), a read-only memory (ROM, not shown), and a random access memory (RAM, not shown). Specifically, the read-only memory has a boot code. When the memory circuit unit 404 is enabled, the microprocessor unit first executes the boot code for loading the control instructions from the rewritable non-volatile memory module 406 into the RAM of the memory management circuit 502. Afterwards, the microprocessor unit executes the control instructions for data operations, such as data writing, data reading and data erasing.

Additionally, in another exemplary embodiment, the control instructions of the memory management circuit 502 may also be implemented in a hardware form. For example, the memory management circuit 502 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage the physical erasing units of the rewritable non-volatile memory module 406, the memory writing circuit is configured to issue a write command to the rewritable non-volatile memory module 406 to write data into the rewritable non-volatile memory module 406, the memory reading circuit is configured to issue a read command to the rewritable non-volatile memory module 406 to read data from the rewritable non-volatile memory module 406, the memory erasing circuit is configured to issue an erase command to the rewritable non-volatile memory module 406 to erase data from the rewritable non-volatile memory module 406, and the data processing circuit is configured to process data to be written into the rewritable non-volatile memory module 406 or data read from the rewritable non-volatile memory module 406.

The host interface 504 is coupled to the memory management circuit 502 and configured to couple to the connection interface unit 402 to receive and identify commands and data transmitted by the host system 11. That is, the commands and the data transmitted by the host system 11 are transmitted to the memory management circuit 502 through the host interface 504. In the present exemplary embodiment, the host interface 504 complies with the SATA standard. However, it should be understood that the present invention is not limited thereto, and the host interface 504 may also comply with the PATA standard, the IEEE 1394 standard, the PCI Express standard, the USB standard, the UHS-I standard, the UHS-II standard, the SD standard, the MS standard, the MMC standard, the CF standard, the IDE standard, or other suitable standards for data transmission.

The memory interface 506 is coupled to the memory management circuit 502 and configured to access the rewritable non-volatile memory module 406. In other words, the data to be written into the rewritable non-volatile memory module 406 is converted to an acceptable format for the rewritable non-volatile memory module 406 through the memory interface 506.

The buffer memory 508 is coupled to the memory management circuit 502 and configured to temporarily store data and commands from the host system 11 or data from the rewritable non-volatile memory module 406.

The power management circuit 510 is coupled to the memory management circuit 502 and configured to control the power of the memory storage device 10.

The error checking and correcting circuit 512 is coupled to the memory management circuit 502 and configured to perform an error checking and correcting procedure to ensure data accuracy. To be specific, when the memory management circuit 502 receives a write command from the host system 11, the error checking and correcting circuit 512 generates an error checking and correcting (ECC) code for the data corresponding to the write command, the memory management circuit 502 writes the data and the ECC code corresponding to the writing command into the rewritable non-volatile memory module 406. Subsequently, when reading the data from the rewritable non-volatile memory module 406, the memory management circuit 502 simultaneously reads the ECC code corresponding to the data, and the error checking and correcting circuit 512 performs the error checking and correcting procedure on the read data according to the ECC code.

In the present exemplary embodiment, a basic unit for the error checking and correcting circuit 512 to perform an encoding procedure is a frame. A frame contains a plurality of data bits. In the present exemplary embodiment, a frame contains 256 bits. However, in another exemplary embodiment, a frame may also contain more or less bits.

In the present exemplary embodiment, the error checking and correcting circuit 512 may perform a single-frame encoding operation on data stored in a physical page or perform a multi-frame encoding operation on data stored in multiple physical pages. The single-frame encoding and the multi-frame encoding operations may respectively be implemented by apply at least one encoding algorithm for encoding, such as a low density parity code (LDPC) algorithm, a BCH code algorithm, a convolutional code algorithm or a turbo code algorithm. Alternatively, in another exemplary embodiment, the multi-frame encoding operation may also be implemented by a Reed-Solomon codes (RS codes) algorithm. Additionally, in another exemplary embodiment, more encoding algorithms that are not included in the above-listed algorithms may also be employed, which will not be repeatedly described. According to the employed encoding algorithm, the error checking and correcting circuit 512 may encode data to be protected to generate a corresponding error-correcting code and/or error-checking code. In the present exemplary embodiment, the error-correcting code and/or the error-checking code which are generated through encoding are collectively referred to as a parity code.

Figure 7:
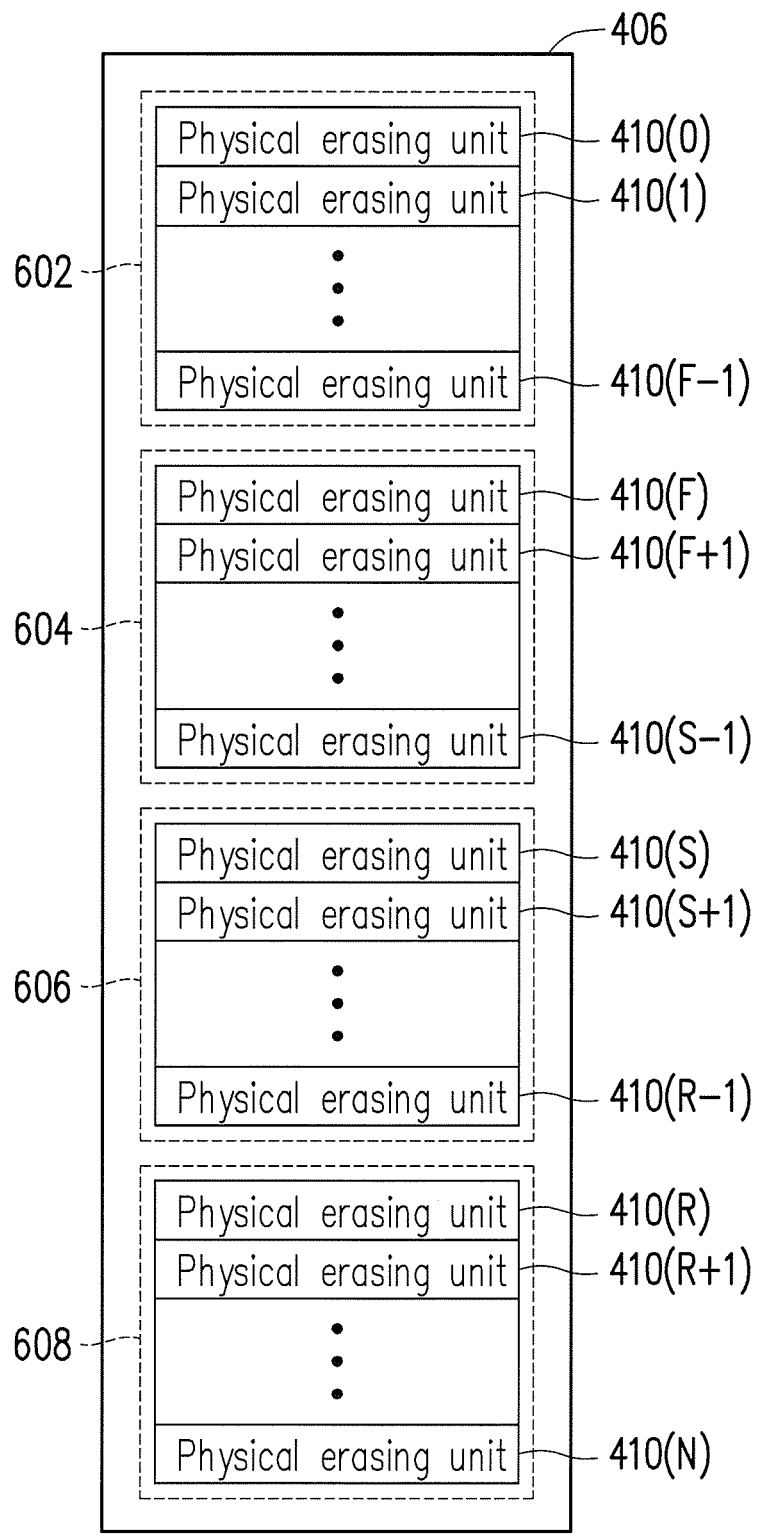
FIG. 7 and FIG. 8 are exemplary schematic diagrams illustrating examples of managing the physical erasing units according to an exemplary embodiment.
Figure 8:
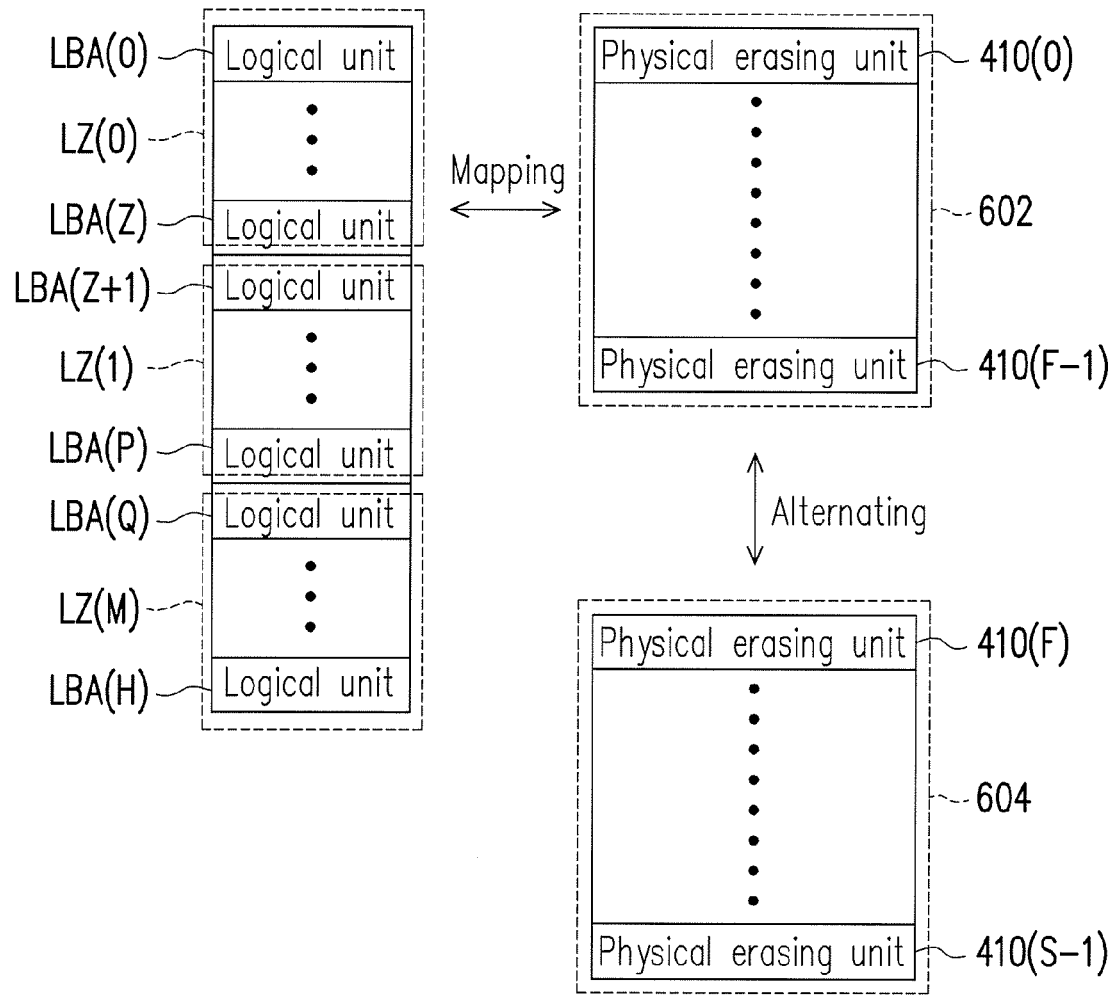

FIG. 7 and FIG. 8 are exemplary schematic diagrams illustrating examples of managing the physical erasing units according to an exemplary embodiment.

It should be understood that terms, such as "get", "select", "group", "divide", "associate" and so forth, are logical concepts which are used to describe operations in the physical erasing units of the rewritable non-volatile memory module 406. That is, the physical erasing units of the rewritable non-volatile memory module are logically operated, but actual positions of the physical erasing units of the rewritable non-volatile memory module are not changed.

Referring to FIG. 7, the memory control circuit unit 404 (or the memory management circuit 502) logically groups the physical erasing units 410(0)-410(N) into a data area 602, a spare area 604, a system area 606 and a replacement area 608.

The physical erasing units logically belonging to the data area 602 and the spare area 604 are configured to store data from the host system 11. To be specific, the physical erasing units of the data area 602 are considered as the physical erasing units which have been used for storing data, and the physical erasing units of the spare area 604 are used for replacing the physical erasing units of the data area 602. Namely, when a write command and data to be written are received from the host system 11, the memory management circuit 502 selects a physical erasing unit from the spare area 604 and writes the data into the selected physical erasing unit to replace the physical erasing unit of the data area 602.

The physical erasing units logically belonging to the data area 606 are configured to record system data. For instance, the system data includes the manufacturers and models of the rewritable non-volatile memory module, the number of physical erasing units in the rewritable non-volatile memory module, the number of physical programming units in each physical erasing unit, and so on.

The physical erasing units logically belonging to the replacement area 608 are used in a bad physical erasing unit replacement procedure for replacing damaged physical erasing units. Specifically, if there are still normal physical erasing units in the replacement area, and a physical erasing unit in the data area 602 is damaged, the memory management circuit 502 selects a normal physical erasing unit from the replacement area 608 to replace the damaged physical block.

In particular, the numbers of the physical erasing units in the data area 602, the spare area 604, the system area 606 and the replacement area 608 vary with different memory module standards. Additionally, it should be understood that the grouping relations of associating the physical erasing units with the data area 602, the spare area 604, the system area 606 and the replacement area 608 are dynamically changed in the operations of the memory storage device 10. For example, when a physical erasing unit in the spare area 604 is damaged and replaced by a physical erasing unit in the replacement area 608, the physical erasing unit which is previously in the replacement area 608 is associated with the spare area 604.

Referring to FIG. 8, the memory control circuit unit 404 (or the memory management circuit 502) configures logical units LBA(0) to LBA(H) for mapping the physical erasing units in the data are 602, in which each logical unit has a plurality of sub logical units for mapping the physical programming units of the corresponding physical erasing unit. Meanwhile, when the host system 11 is to write data into a logical unit or update data stored in the logical unit, the memory control circuit unit 404 (or the memory management circuit 502) selects a physical erasing unit from the spare area 604 for writing the data to substitute for the physical erasing unit in the data area 602. In the present exemplary embodiment, a sub logical unit may also be a logical page or a logical sector.

In the present exemplary embodiment, the memory control circuit unit 404 (or the memory management circuit 502) records the mapping relationship between the logical units and the physical erasing units to identify which physical erasing unit the data of each logical unit is stored in. And, when the host system 11 is to access data in a sub logical unit, the memory control circuit unit 404 (or the memory management circuit 502) determines the logical unit that the sub logical unit belongs to and accesses the data in the physical erasing unit that the logical unit is mapped to. For instance, in the present exemplary embodiment, the memory control circuit unit 404 (or the memory management circuit 502) stores a logical-physical address mapping table in the rewritable non-volatile memory module 406 to record the physical erasing unit that each logical unit is mapped to, and when being to access the data, the memory control circuit unit 404 (or the memory management circuit 502) loads the logical-physical address mapping table into the buffer memory 508 for maintenance.

It is to be mentioned that the buffer memory 508 may be incapable of recording mapping tables recording the mapping relations for all logical units due to its limited capacity. Therefore, in the present exemplary embodiment, the memory control circuit unit 404 (or the memory management circuit 502) groups the logical units LBA(0) to LBA(H) to a plurality of logical zones LZ(0) to LZ(M) and assigns a logical-physical address mapping table for each logical zone. Specially, when the memory control circuit unit 404 (or the memory management circuit 502) is to update the mapping with respect to a certain logical unit, the logical-physical address mapping table of the logical zone belonging to the logical unit is loaded into the buffer memory 508 and then updated.

As described above, in the present exemplary embodiment, the data bit area of each physical page of the rewritable non-volatile memory module 406 stores user data, and the redundant bit area of each physical page stores a parity code corresponding to the user data. Specially, the memory control circuit unit 404 (or the memory management circuit 502) assigns the physical pages into a plurality of encoding groups (i.e., each encoding group includes one or more physical pages). Furthermore, the error checking and correcting circuit 512 additionally generates a group parity code corresponding to each encoding group according to the data stored in the physical pages grouped to the same encoding group. For example, the memory control circuit unit 404 (or the error checking and correcting circuit 512) generates the group parity code corresponding to each encoding group according to the data stored in the data areas of the physical pages grouped to the same encoding group. Additionally, the memory control circuit unit 404 (or the memory management circuit 502) stores the generated group parity codes in the physical pages of the rewritable non-volatile memory module 406. Afterwards, if data read from a data area of a physical page fails to be corrected according to a parity code stored in the redundant bit area of the physical page, the memory control circuit unit 404 (or the memory management circuit 502) corrects the read data by using the corresponding group parity code.

Specifically, the memory control circuit unit 404 (or the memory management circuit 502) determines an encoding group of a physical page according to a word line, a plane or a channel corresponding to the physical page. For example, the memory control circuit unit 404 (or the memory management circuit 502) may first calculate an assigning order for a word line, a plane or a channel corresponding to each physical page and assign the corresponding physical pages to different encoding groups according to the assigning order. In addition, the memory control circuit unit 404 (or the memory management circuit 502) may also record the corresponding relationship between the physical pages and the encoding groups in a lookup table, such that the error checking and correcting circuit 512 may identify the physical pages belonging to the same encoding group according to the lookup table to perform the encoding operation to generate the group parity code. In the present exemplary embodiment, the error checking and correcting circuit 512 performs the encoding operation on the physical pages belonging to the same encoding group to generate a plurality of parity codes and then superposes the generated parity codes to generate the group parity code, but the present invention is not limited thereto. In other exemplary embodiments, the error checking and correcting circuit 512 may also performs the encoding operation on multiple physical pages belonging to the same encoding group to generate the group parity code.

Several exemplary embodiments are provided below for describing the operation of assigning a plurality of physical pages into a plurality of encoding groups. It should be noted that the MLC NAND flash memory is illustrated as an example in the following exemplary embodiments, but the related operations may also be applied to other types of flash memories (e.g., the TLC NAND flash memory).

In an exemplary embodiment, the memory control circuit unit 404 (or the memory management circuit 502) assigns the physical pages on the same word line into different encoding groups, such that the physical pages on the same word line may be respectively encoded.

Figure 9:
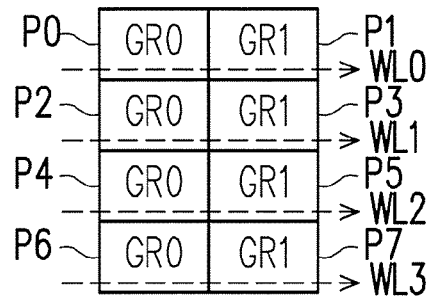
FIG. 9 is a schematic diagram of assigning the physical pages on the same word line into a plurality of encoding groups according to an exemplary embodiment.

FIG. 9 is a schematic diagram of assigning the physical pages on the same word line into a plurality of encoding groups according to an exemplary embodiment.

Referring to FIG. 9, the rewritable non-volatile memory module includes word lines WL0 to WL3, and the memory cells on each word line constitute two physical pages, including a lower physical page and an upper physical page. For instance, physical pages P0, P2, P4 and P6 are lower physical pages, and physical pages P1, p3, p5 and P7 are upper physical pages respectively corresponding to the physical pages P0, P2, P4 and P6. In the present exemplary embodiment, the memory control circuit unit 404 (or the memory management circuit 502) assigns the physical pages on the same word line into different encoding groups. The memory control circuit unit 404 (or the memory management circuit 502) may sequentially group the lower physical page and the upper physical page on each word line to different encoding groups according to an order of the word lines. Referring to FIG. 9, the memory control circuit unit 404 (or the memory management circuit 502) groups the physical page P0 on the word line WL0 to an encoding group GR0, and groups the physical page P1 on the word line WL0 to an encoding group GR1. In the same way, the physical pages P2 and P3 on the word line WL1 are respectively grouped to the encoding groups GR0 and GR1, the physical pages P4 and P5 on the word line WL2 are respectively grouped to the encoding groups GR0 and GR1, and the physical page P6 and the physical page P7 on the word line WL3 are respectively grouped to the encoding groups GR0 and GR1.

Furthermore, the memory control circuit unit 404 (or the error checking and correcting circuit 512) generates a group parity code corresponding to the encoding group GR0 and a group parity code corresponding to the encoding group GR1. For instance, the memory control circuit unit 404 (or the error checking and correcting circuit 512) may be configured with an encoding engine corresponding to each encoding group, such that the encoding engine corresponding to the encoding group GR0 may generate a group parity code corresponding to the encoding group GR0 according to the physical pages P0, P2, P4 and P6 which are grouped to the encoding group GR0, and the encoding engine corresponding to the encoding group GR1 may generate a group parity code corresponding to the encoding group GR1 according to the physical pages P1, P3, P5 and P7 which are grouped to the encoding group GR1. In addition, the memory control circuit unit 404 (or the memory management circuit 502) stores the group parity code corresponding to the encoding group GR0 and the group parity code corresponding to the encoding group GR1 in the same or different physical pages of the rewritable non-volatile memory module. Additionally, the parity code of each physical page may be independently encoded by the encoding engine corresponding to the encoding group thereof or collectively encoded after a predetermined capacity of data has been collected.

It should be understood that in the exemplary embodiment illustrated in FIG. 9, the memory control circuit unit 404 (or the memory management circuit 502) is configured with the encoding engine corresponding to each encoding group, and the encoding engines perform the encoding operation by using the same encoding algorithm. However, the present invention is not limited thereto. In another exemplary embodiment, the encoding engine corresponding to each encoding group may perform the encoding operation by using different encoding algorithms. In addition, in another exemplary embodiment, the memory control circuit unit 404 (or the error checking and correcting circuit 512) may be configured with only one encoding engine for encoding for each encoding group.

It is to be mentioned that the physical pages on the same word line are grouped to different encoding groups in the present exemplary embodiment, and therefore, the physical pages on different word lines may be grouped to the same encoding group. In other words, in the present exemplary embodiment, two physical pages are included on the same word line, and thus, two different encoding groups may be configured, i.e., the physical pages on the same word line are separated to different encoding groups to be respectively encoded. However, the present invention is not limited thereto. In other exemplary embodiments, the physical pages may be assigned into more encoding groups.

In another exemplary embodiment, the memory control circuit unit 404 (or the memory management circuit 502) may assign the physical pages on adjacent word lines into different encoding groups, such that the physical pages on the adjacent word lines may be respectively encoded.

Figure 10:
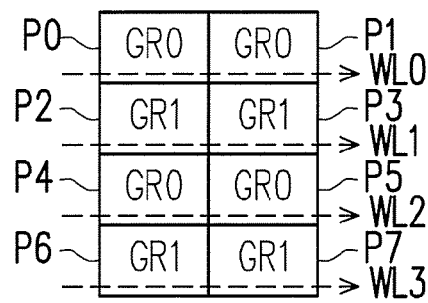
FIG. 10 is a schematic diagram of assigning the physical pages on adjacent word lines into a plurality of encoding groups according to an exemplary embodiment.

FIG. 10 is a schematic diagram illustrating the assignment of the physical pages on adjacent word lines into a plurality of encoding groups according to an exemplary embodiment.

The structure of the physical pages of the exemplary embodiment illustrated in FIG. 10 is the same as that of the exemplary embodiment illustrated in FIG. 9, and the difference therebetween lies in that in the exemplary embodiment illustrated in FIG. 10, the memory control circuit unit 404 (or the memory management circuit 502) groups the physical pages on the adjacent word lines into different encoding groups, where the memory control circuit unit 404 (or the memory management circuit 502) sequentially groups the physical pages to different encoding groups according to the order of the word lines. Referring to FIG. 10, according to the order of the word lines, the word line WL0 is adjacent to the word line WL1, the word line WL1 is simultaneously adjacent to the word line WL0 and the word line WL2, and the word line WL2 is simultaneously adjacent to the word line WL1 and the word line WL3. According to the aforementioned adjacency relationship, the memory control circuit unit 404 (or the memory management circuit 502) groups the physical pages on the word line WL0 (which are the physical pages P0 and P1) to the encoding group GR0, groups the physical pages on the adjacent word line WL1 (which are the physical pages P2 and P3) to the encoding group GR1, groups the physical pages on the word line WL2 (which are the physical pages P4 and P5) to the encoding group GR0, and groups the physical pages on the word line WL3 (which are the physical pages P6 and P7) to the encoding group GR1.

Furthermore, the memory control circuit unit 404 (or the error checking and correcting circuit 512) generates the group parity code corresponding to the encoding group GR0 and the group parity code corresponding to the encoding group GR1. For instance, the encoding engine corresponding to the encoding group GR0 generates the group parity code corresponding to the encoding group GR0 according to the physical pages P0, P1, P4 and P5 which are grouped to the encoding group GR0, and the encoding engine corresponding to the encoding group GR1 generates the group parity code corresponding to the encoding group GR1 according to the physical pages P2, P3, P6 and P7 which are grouped to the encoding group GR1. The memory control circuit unit 404 (or the memory management circuit 502) stores the group parity code corresponding to the encoding group GR0 and the group parity code corresponding to the encoding group GR1 in different physical pages of the rewritable non-volatile memory module.

It should be understood that in the exemplary embodiment illustrated in FIG. 10, the memory control circuit unit 404 (or the memory management circuit 502) is configured with the encoding engine corresponding to each encoding group, and the encoding engines perform the encoding operation by using the same encoding algorithm. However, the present invention is not limited thereto. In another exemplary embodiment, the encoding engine corresponding to each encoding group may perform the encoding operation by using different encoding algorithms. Besides, in another exemplary embodiment, the memory control circuit unit 404 (or the error checking and correcting circuit 512) may be configured with only one encoding engine for encoding for each encoding group.

It is to be mentioned that the word line WL2 is adjacent to the word line WL1, but not adjacent to the word line WL0. Therefore, the physical pages on the word line WL2 do not have to be grouped to the encoding group which is different from that of the physical pages on the word line WL0. In other words, the physical pages on the word line WL2 and the physical pages on the word line WL0 may be grouped to the same encoding group. Similarly, the word line WL3 is adjacent to the word line WL2, but not adjacent to the word line WL1. Therefore, the physical pages on the word line WL3 and the physical pages on the word line WL1 may also be grouped the same encoding group. That is to say, in the present exemplary embodiment, the physical pages on the adjacent word lines may be separated to different encoding groups to be respectively encoded only by means of configuring two different encoding groups. However, the present invention is not limited thereto. In other exemplary embodiments, the physical pages may be grouped to more encoding groups.

In another exemplary embodiment, the memory control circuit unit 404 (or the memory management circuit 502) may further assign the physical pages on the same word line and the physical pages on adjacent word lines into different encoding groups, such that all the physical pages on the adjacent word lines may be respectively encoded.

Figure 11:
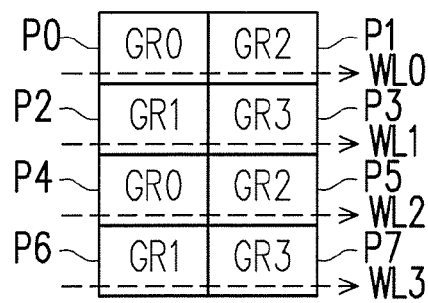
FIG. 11 is a schematic diagram of assigning the physical pages on the same word line into a plurality of encoding groups according to another exemplary embodiment.

FIG. 11 is a schematic diagram illustrating the assignment of the physical pages on the same word line into a plurality of encoding groups according to another exemplary embodiment.

The structure of the physical pages of the exemplary embodiment illustrated in FIG. 11 is the same as that of the exemplary embodiments illustrated in FIG. 9 and FIG. 10, and the difference therebetween lies in that in the exemplary embodiment illustrated in FIG. 11, the memory control circuit unit 404 (or the memory management circuit 502) assigns both the physical pages on the same word line and the physical pages on adjacent word lines into different encoding groups. The memory control circuit unit 404 (or the memory management circuit 502) sequentially groups the lower physical pages and the upper physical pages on adjacent word lines to different encoding groups according to the order of the word lines. Referring to FIG. 11, the memory control circuit unit 404 (or the memory management circuit 502) groups the physical page P0 (also referred to as a first physical page) on the word line WL0 (also referred to as a first word line) to the encoding group GR0 (also referred to as a first encoding group), groups the physical page P2 (also referred to as a second physical page) on the word line WL1 (also referred to as a second word line) to the encoding group GR1 (also referred to as a second encoding group), groups the physical page P1 (also referred to as a third physical page) on the first word line to an encoding group GR2 (also referred to as a third encoding group), and groups the physical page P3 (also referred to as a fourth physical page) on the second word line to an encoding group GR3 (also referred to as a fourth encoding group). In the same way, the physical page P4 on the word line WL2 is grouped to the first encoding group (i.e., the encoding group GR0), the physical page P6 on the word line WL3 is grouped to the second encoding group (i.e., the encoding group GR1), the physical page P5 on the word line WL2 is grouped to the third encoding group (i.e., the encoding group GR2), and the physical page P7 on the word line WL3 is grouped to the fourth encoding group (i.e., the encoding group GR3). Therefore, the four physical pages on the adjacent word lines are all assigned into different encoding groups.

Further, the memory control circuit unit 404 (or the error checking and correcting circuit 512) respectively generates a group parity code corresponding to the encoding group GR0 (which is also referred to as a first group parity code), a group parity code corresponding to the encoding group GR1 (which is also referred to as a second group parity code), a group parity code corresponding to the encoding group GR2 (which is also referred to as a third group parity code), and a group parity code corresponding to the encoding encoding group GR3 (which is also referred to as a fourth group parity code). For instance, in the memory control circuit unit 404 (or the error checking and correcting circuit 512), the encoding engine corresponding to the first encoding group generates the first group parity code according to the physical pages P0 and P4 which are grouped to the first encoding group, the encoding engine corresponding to the second encoding group generates the second group parity code according to the physical pages P2 and P6 which are grouped to the second encoding group, the encoding engine corresponding to the third encoding group generates the third group parity code according to the physical pages P1 and P5 which are grouped to the third encoding group, and the encoding engine corresponding to the fourth encoding group generates the fourth group parity code according to the physical pages P3 and P7 which are grouped to the fourth encoding group. Besides, the memory control circuit unit 404 (or the memory management circuit 502) stores the first group parity code, the second group parity code, the third group parity code and the fourth group parity code in different physical pages of the rewritable non-volatile memory module.

It should be understood that in the exemplary embodiment illustrated in FIG. 11, the memory control circuit unit 404 (or the memory management circuit 502) is configured with the encoding engine corresponding to each encoding group, and the encoding engines perform the encoding operation by using the same encoding algorithm. However, the present invention is not limited thereto. In another exemplary embodiment, the encoding engine corresponding to each encoding group may perform the encoding operation by using different encoding algorithms. Besides, in another exemplary embodiment, the memory control circuit unit 404 (or the error checking and correcting circuit 512) may be configured with only one encoding engine for encoding for each encoding group.

It is to be mentioned that the physical pages on the same word line and the physical pages on the adjacent word lines are all respectively grouped to different encoding groups in the present exemplary embodiment. Therefore, the physical pages on non-adjacent word lines (e.g., the physical page P0 on the word line WL0 and the physical page P4 on the word line WL2) may be assigned into the same encoding group. In other words, in the present exemplary embodiment, two physical pages are included on the same word line, four physical pages are included on two adjacent word lines, and therefore, the four physical pages on the adjacent word lines may be grouped to different encoding groups to be separately encoded by means of configuring four different encoding groups. However, the present invention is not limited thereto. In other exemplary embodiments, the physical pages may be assigned into more encoding groups.

In the rewritable non-volatile memory module including a plurality of planes, a plurality of physical pages belonging to different planes may constitute a super physical page. The memory control circuit unit 404 (or the memory management circuit 502) simultaneously writes data into multiple physical pages of a super physical page by a multi-plane programming operation, so as to enhance efficiency of data access. Thus, in another exemplary embodiment, besides assigning all the physical pages on the adjacent word lines into different encoding groups, the memory control circuit unit 404 (or the memory management circuit 502) further assigns multiple physical pages of a super physical page into different encoding groups.

Figure 12:
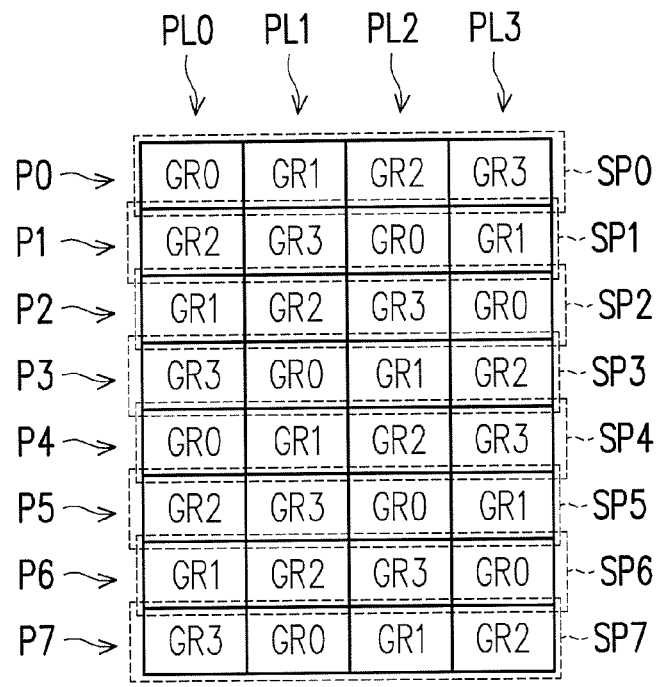
FIG. 12 is a schematic diagram of assigning the physical pages in the super physical pages corresponding to different planes into a plurality of encoding groups according to an exemplary embodiment.

FIG. 12 is a schematic diagram illustrating the assignment of the physical pages in the super physical pages corresponding to different planes into a plurality of encoding groups according to an exemplary embodiment. It is to be mentioned that the present exemplary embodiment illustrated in FIG. 12 is described based on the exemplary embodiment illustrated in FIG. 11. In other words, in the exemplary embodiment illustrated in FIG. 12, the physical pages on the adjacent word lines are all assigned into different encoding groups.

Referring to FIG. 12, the rewritable non-volatile memory module has four planes, i.e., planes PL0, PL1, PL2 and PL3, and the physical pages P0 to P7 in each plane have the same structure as the physical pages P0 to P7 of the exemplary embodiment illustrated in FIG. 11. Namely, in each plane, the physical pages P0, P2, P4 and P6 are lower physical pages, and the physical pages P1, P3, P5 and P7 are upper physical pages. For descriptive convenience, in the present exemplary embodiment, the physical pages P0, P2, P4 and P6 in each plane are sequentially arranged in the manner as illustrated in FIG. 12. The first physical page, the second physical page, the third physical page and the fourth physical page in FIG. 11 are respectively the physical page P0 in the plane PL0, the physical page P2 in the plane PL0, the physical page P1 in the plane PL0 and the physical page P3 in the plane PL0 in FIG. 12. In the present exemplary embodiment, the four physical pages arranged in the same order in different planes are grouped to one super physical page. For instance, the first physical page, the physical page P0 in the plane PL1 (which is also referred to as a fifth physical page), the physical page P0 in the plane PL2 (which is also referred to as a sixth physical page) and the physical page P0 in the plane PL3 (which is also referred to as a seventh physical page) are grouped to a super physical page SP0 (which is also referred to as a first super physical page). In addition, the third physical page, the physical page P1 in the plane PL1, the physical page P1 in the plane PL2 and the physical page P1 in the plane PL3 are grouped to a super physical page SP1. In the same way, all the physical pages in the planes PL0 to PL3 may be respectively grouped to super physical pages SP0 to SP7.

Referring to FIG. 12, in the same way as the exemplary embodiment illustrated in FIG. 11, the memory control circuit unit 404 (or the memory management circuit 502) groups all the physical pages on the adjacent word lines in the same plane to different encoding groups. For instance, the first physical page is grouped to the first encoding group (i.e., the encoding group GR0), the second physical page is grouped to the second encoding group (i.e., the encoding group GR1), the third physical page is grouped to the third encoding group (i.e., the encoding group GR2), and the fourth physical page is grouped to the fourth encoding group (i.e., the encoding group GR3). In the present exemplary embodiment, the memory control circuit unit 404 (or the memory management circuit 502) further groups the physical pages which belong to different planes in the same super physical page and are capable of being simultaneously programmed to different encoding groups. The memory control circuit unit 404 (or the memory management circuit 502) may first group the physical pages on the adjacent word lines to different encoding groups according to the order of the word lines, and then group the physical pages belonging to different planes in the super physical page to different encoding groups. Referring to FIG. 12, the first physical page, the fifth physical page, the sixth physical page and the seventh physical page are grouped to the first super physical page, for example, and thus, the memory control circuit unit 404 (or the memory management circuit 502) respectively groups the fifth physical page, the sixth physical page and the seventh physical page to the second encoding group (i.e., the encoding group GR1), the third encoding group (i.e., the encoding group GR2) and the fourth encoding group (i.e., the encoding group GR3) different from the first encoding group (i.e., the encoding group GR0). In addition, the third physical page and the physical page P1 in the plane PL1, the physical page P1 in the plane PL2 and the physical page P1 in the plane PL3 are grouped to the super physical page SP1, and thus, the memory control circuit unit 404 (or the memory management circuit 502) also respectively groups the physical page P1 in the plane PL1, the physical page P1 in the plane PL2 and the physical page in the plane PL3 to the fourth encoding group (i.e., the encoding group GR3), the first encoding group (i.e., the encoding group GR0) and the second encoding group (i.e., the encoding group GR1) different from the third encoding group (i.e., the encoding group GR2). In the same way, referring to FIG. 12, the physical pages belonging to different planes in each super physical page to different encoding groups are grouped to different encoding groups.

Furthermore, the memory control circuit unit 404 (or the error checking and correcting circuit 512) respectively generates the first group parity code corresponding to the first encoding group, the second group parity code corresponding to the second encoding group, the third group parity code corresponding to the third encoding group and the fourth group parity code corresponding to the fourth encoding group. For instance, according to FIG. 12, in the memory control circuit unit 404 (or the error checking and correcting circuit 512), the encoding engine corresponding to the first encoding group generates the first group parity code according to the physical pages labeled as in the encoding group GR0, the encoding engine corresponding to the second encoding group generates the second group parity code according to the physical pages labeled as in the encoding group GR1, the encoding engine corresponding to the third encoding group generates the third group parity code according to the physical pages labeled as in the encoding group GR2, and the encoding engine corresponding to the fourth encoding group generates the fourth group parity code according to the physical pages labeled as in the encoding group GR3. Besides, the memory control circuit unit 404 (or the memory management circuit 502) stores the first group parity code, the second group parity code, the third group parity code and the fourth group parity code in different physical pages of the rewritable non-volatile memory module.

It should be understood that in the exemplary embodiment illustrated in FIG. 12, the memory control circuit unit 404 (or the memory management circuit 502) is configured with the encoding engine corresponding to each encoding group, and the encoding engines perform the encoding operation by using the same encoding algorithm. However, the present invention is not limited thereto. In another exemplary embodiment, the encoding engine corresponding to each encoding group may perform the encoding operation by using different encoding algorithms. Additionally, in another exemplary embodiment, the memory control circuit unit 404 (or the error checking and correcting circuit 512) may be configured with only one encoding engine for encoding for each encoding group.

In a system having a memory storage device supporting multi-channel access, each plane of the rewritable non-volatile memory module is corresponding to one of a plurality of channels.

Figure 13:
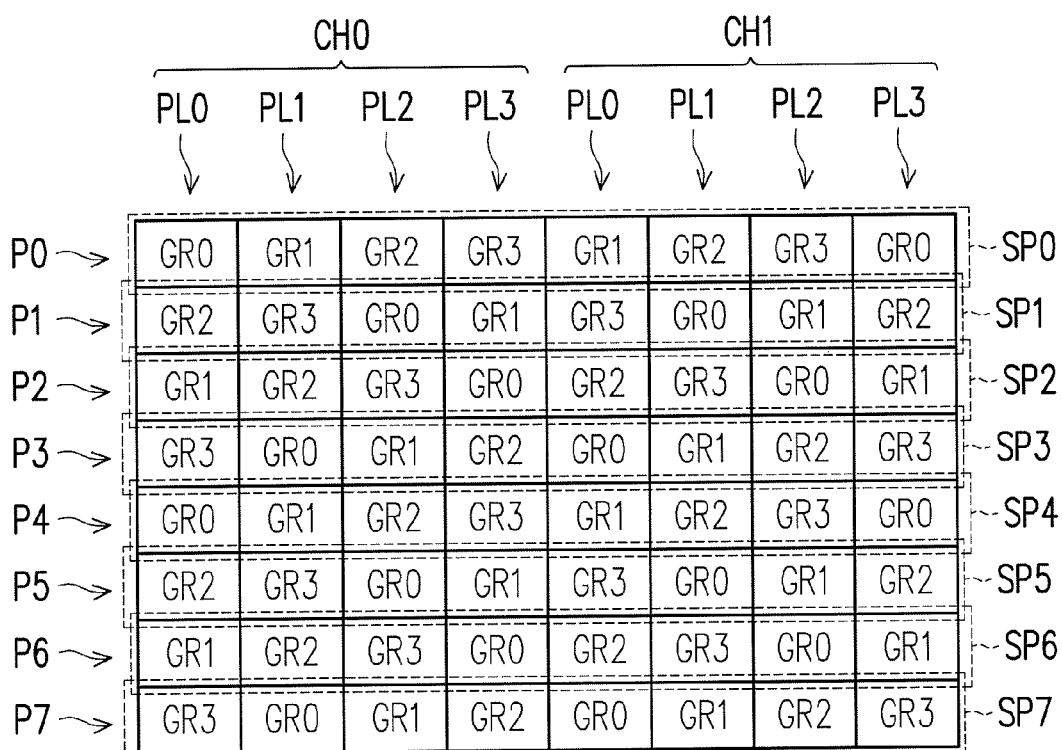
FIG. 13 is a schematic diagram of assigning the physical pages in the super physical pages corresponding to different channels into a plurality of encoding groups according to an exemplary embodiment.

FIG. 13 is a schematic diagram illustrating the assignment of the physical pages in the super physical pages corresponding to different channels into a plurality of encoding groups according to an exemplary embodiment. It is to be mentioned that the present exemplary embodiment illustrated in FIG. 13 is described based on the exemplary embodiment illustrated in FIG. 12. In other words, in the exemplary embodiment illustrated in FIG. 13, all the physical pages on the adjacent word lines and the physical pages which belong to different planes in the same super physical page and are capable of being simultaneously programmed are grouped to different encoding groups.

Referring to FIG. 13, the rewritable non-volatile memory module has two channels, i.e., a channel CH0 (also referred to as a first channel) and a channel CH1 (also referred to as a second channel). Each channel is respectively corresponding to four planes, i.e., the planes PL0, PL1, PL2 and PL3. The physical pages P0 to P7 in each plane have the same structure as the physical pages P0 to P7 of the exemplary embodiment illustrated in FIG. 11. For descriptive convenience, being similar to the exemplary embodiment illustrated in FIG. 12, the physical pages P0 to P7 in each plane are sequentially arranged in the manner as illustrated in FIG. 13 in the present exemplary embodiment. The first physical page, the second physical page, the third physical page and the fourth physical page in FIG. 12 are respectively the physical page P0 in the plane PL0 corresponding to the channel CH0, the physical page P2 in the plane PL0 corresponding to the channel CH0, the physical page P1 in the plane PL0 corresponding to the channel CH0 and the physical page P3 in the plane PL0 corresponding to the channel CH0 illustrated in FIG. 13, while the fifth physical page, the sixth physical page and the seventh physical page in FIG. 12 are respectively the physical page P0 in the plane PL1 corresponding to the channel CH0, the physical page P0 in the plane PL2 corresponding to the channel CH0 and the physical page P0 in the plane PL3 corresponding to the channel CH0 illustrated in FIG. 13. Additionally, the first super physical page illustrated in FIG. 12 is the super physical page SP0 illustrated in FIG. 13. In the present exemplary embodiment, the eight physical pages arranged in the same order in different planes corresponding to different channels are grouped to one super physical page. For instance, the first physical page, the fifth physical page, the sixth physical page, the seventh physical page, the physical page P0 in the plane PL0 corresponding to the channel CH1 (which is referred to as an eighth physical page), the physical page P0 in the plane PL1 corresponding to the channel CH1, the physical page P0 in the plane PL2 corresponding to the channel CH1 and the physical page P0 in the plane PL3 corresponding to the channel CH1 are grouped to the first super physical page, and the third physical page, the physical page P1 in the plane PL1 corresponding to the channel CH0, the physical page P1 in the plane PL2 corresponding to the channel CH0, the physical page P1 in the plane PL3 corresponding to the channel CH0, the physical page P1 in the plane PL0 corresponding to the channel CH1, the physical page P1 in the plane PL1 corresponding to the channel CH1, the physical page P1 in the plane PL2 corresponding to the channel CH1 and the physical page P1 in the plane PL3 corresponding to the channel CH1 are grouped to the super physical page SP1. In the same way, all the physical pages in the planes PL0 to PL3 corresponding to the channel CH0 and all the physical pages in the planes PL0 to PL3 corresponding to the channel CH1 may be respectively grouped to the super physical pages SP0 to SP7.

Referring to FIG. 13, the memory control circuit unit 404 (or the memory management circuit 502) groups the physical pages in the same super physical page which are corresponding to the same channel to different encoding groups. For instance, all the physical pages in the planes PL0 to PL3 corresponding to the channel CH0 are grouped to difference encoding groups in the same way as the exemplary embodiment illustrated in FIG. 12 and will not be repeatedly described. In the present exemplary embodiment, the memory control circuit unit 404 (or the memory management circuit 502) further groups the physical pages in the super physical pages to a plurality of encoding groups according to the channels which the physical pages are corresponding to. For instance, the first super physical page (i.e., the super physical page SP0) includes the first physical page (i.e., the physical page P0 in the plane PL0 corresponding to the channel CH0) corresponding to the first channel (i.e., the channel CH0), and the memory control circuit unit 404 (or the memory management circuit 502) groups the first physical page to the first encoding group (i.e., the encoding group GR0). In addition, the first super physical page also includes the eighth physical page (i.e., the physical page P0 in the plane PL0 corresponding to the channel CH1) corresponding to the second channel (i.e., the channel CH1), and thus, the memory control circuit unit 404 (or the memory management circuit 502) groups the eighth physical page to the second encoding group (i.e., the encoding group GR1) different from the first encoding group. Meanwhile, the memory control circuit unit 404 (or the memory management circuit 502) also respectively groups the physical pages in the planes PL0 to PL3 corresponding to the second channel (i.e., the channel CH1) to different encoding groups. For instance, the physical page P0 in the plane PL1 corresponding to the second channel is grouped to the third encoding group (i.e., the encoding group GR2), the physical page P0 in the plane PL2 corresponding to the second channel is grouped to the fourth encoding group (i.e., the encoding group GR3), and the physical page P0 in the plane PL3 corresponding to the second channel is grouped to the first encoding group (i.e., the encoding group GR0).

Furthermore, the memory control circuit unit 404 (or the error checking and correcting circuit 512) respectively generates the first group parity code corresponding to the first encoding group, the group parity code corresponding to the second encoding group, the third group parity code corresponding to the third encoding group and the fourth group parity code corresponding to the fourth encoding group. For instance, according to FIG. 13, in the memory control circuit unit 404 (or the error checking and correcting circuit 512), the encoding engine corresponding to the first encoding group generates the first group parity code according to the physical pages labeled as in the encoding group GR0, the encoding engine corresponding to the second encoding group generates the second group parity code according to the physical pages labeled as in the encoding group GR1, the encoding engine corresponding to the third encoding group generates the third group parity code according to the physical pages labeled as in the encoding group GR2, and the encoding engine corresponding to the fourth encoding group generates the fourth group parity code according to the physical pages labeled as in the encoding group GR3. Besides, the memory control circuit unit 404 (or the memory management circuit 502) stores the first group parity code, the second group parity code, the third group parity code and the fourth group parity code in different physical pages of the rewritable non-volatile memory module.

Additionally, in the present exemplary embodiment, the error checking and correcting circuit 512 of the memory control circuit unit 404 further includes a plurality of encode circuits. Thus, in the aforementioned system supporting multi-channel access, the memory control circuit unit 404 (or the memory management circuit 502) performs the encoding operation on the physical pages belonging to different encoding groups by simultaneously using the plurality of encode circuits through different channels.

Afterwards, when reading data of a specific physical page, the memory control circuit unit 404 (or the memory management circuit 502) first corrects user data read from the data bit area of the physical page by using a parity code read from the redundancy bit area of the physical page. If failing to correct the user data, the memory control circuit unit 404 (or the memory management circuit 502) corrects the user data by using the group parity code corresponding to the encoding group which the physical page belongs to. For instance, in the exemplary embodiment illustrated in FIG. 13, the memory control circuit unit 404 (or the memory management circuit 502) groups the first physical page (i.e., the physical page in the plane PL0 corresponding to the channel CH0) to the first encoding group (i.e., the encoding group GR0). When reading data of a specific physical page, the memory control circuit unit 404 (or the memory management circuit 502) first corrects the user data read from the first physical page by using a parity code read from the first physical page. If failing to correct the user data, the memory control circuit unit 404 (or the memory management circuit 502) further reads the group parity code corresponding to the first encoding group which is stored in another physical page and uses the group parity code to correct the user data.

Figure 14:
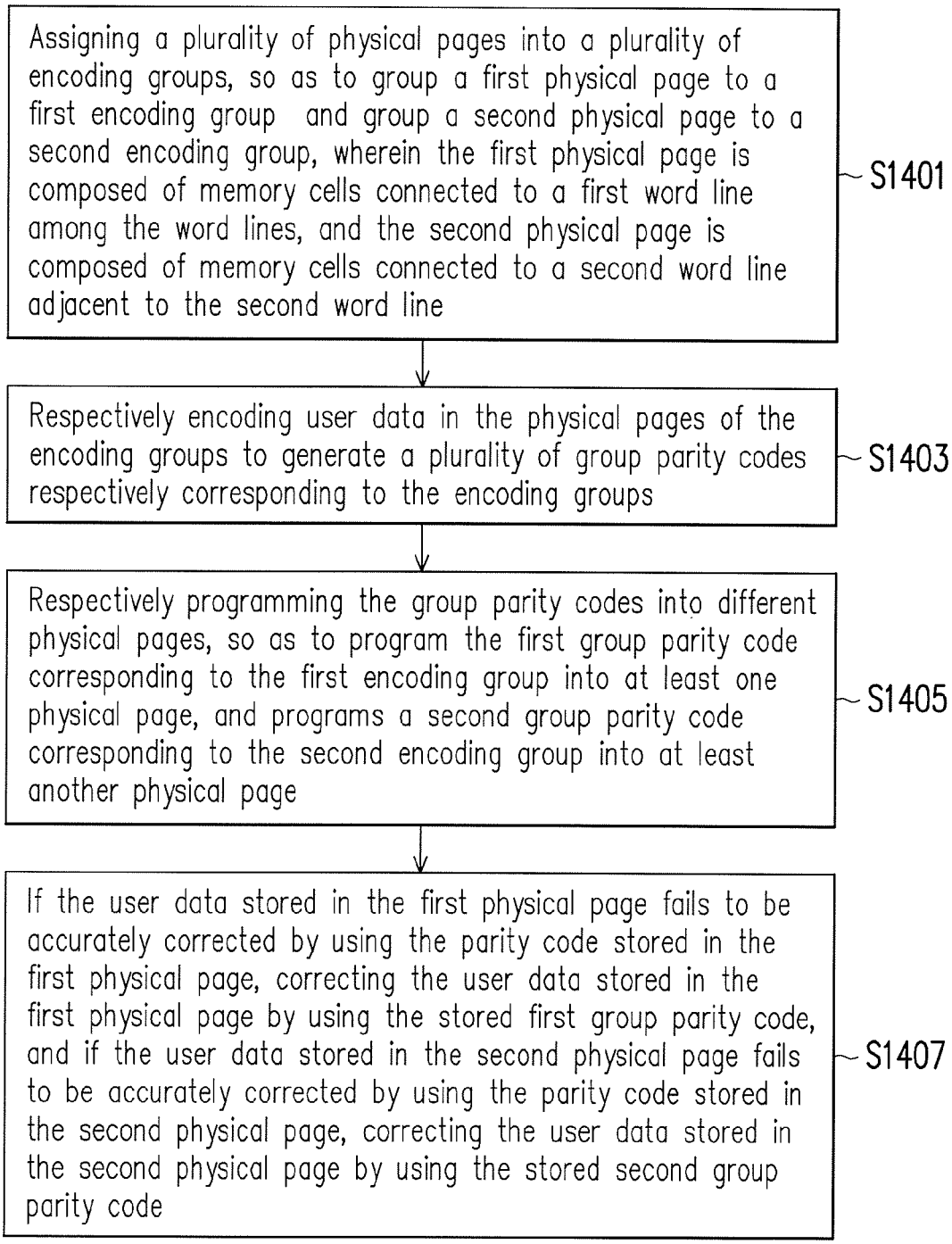
FIG. 14 is a flowchart illustrating a data protecting method according to an exemplary embodiment of the present invention.

FIG. 14 is a flowchart illustrating a data protecting method according to an exemplary embodiment.

Referring to FIG. 14, in step S1401, the memory control circuit unit 404 (or the memory management circuit 502) assigns a plurality of physical pages into a plurality of encoding groups, so as to group the first physical page to the first encoding group, and group the second physical page to the second encoding group. The first physical page is composed of the memory cells connected to the first word line, and the second physical page is composed of the memory cells connected to the second word line adjacent to the first word line. The physical pages store user data and parity codes corresponding to the user data. It is to be mentioned that in this step, the memory control circuit unit 404 (or the memory management circuit 502) may further group different physical pages to different encoding groups according to other grouping manners. The grouping manner related to this step has been described in detail in the exemplary embodiments illustrated in FIG. 9 to FIG. 13 and will not be repeatedly described.

In step S1403, the memory control circuit unit 404 (or the memory management circuit 502) respectively encodes the user data in the physical pages of the encoding groups to generate a plurality of group parity codes respectively corresponding to the encoding groups.

In step S1405, the memory control circuit unit 404 (or the memory management circuit 502) respectively programs the group parity codes into different physical pages, so as to program the first group parity code corresponding to the first encoding group into at least one physical page, and programs a second group parity code corresponding to the second encoding group into at least another physical page.

In step S1407, if the user data stored in the first physical page fails to be accurately corrected by using the parity code stored in the first physical page, the memory control circuit unit 404 (or the memory management circuit 502) corrects the user data stored in the first physical page by using the stored first group parity code, and if the user data stored in the second physical page fails to be accurately corrected by using the parity code stored in the second physical page, the memory control circuit unit 404 (or the memory management circuit 502) corrects the user data stored in the second physical page by using the stored second group parity code.

Figure 15:
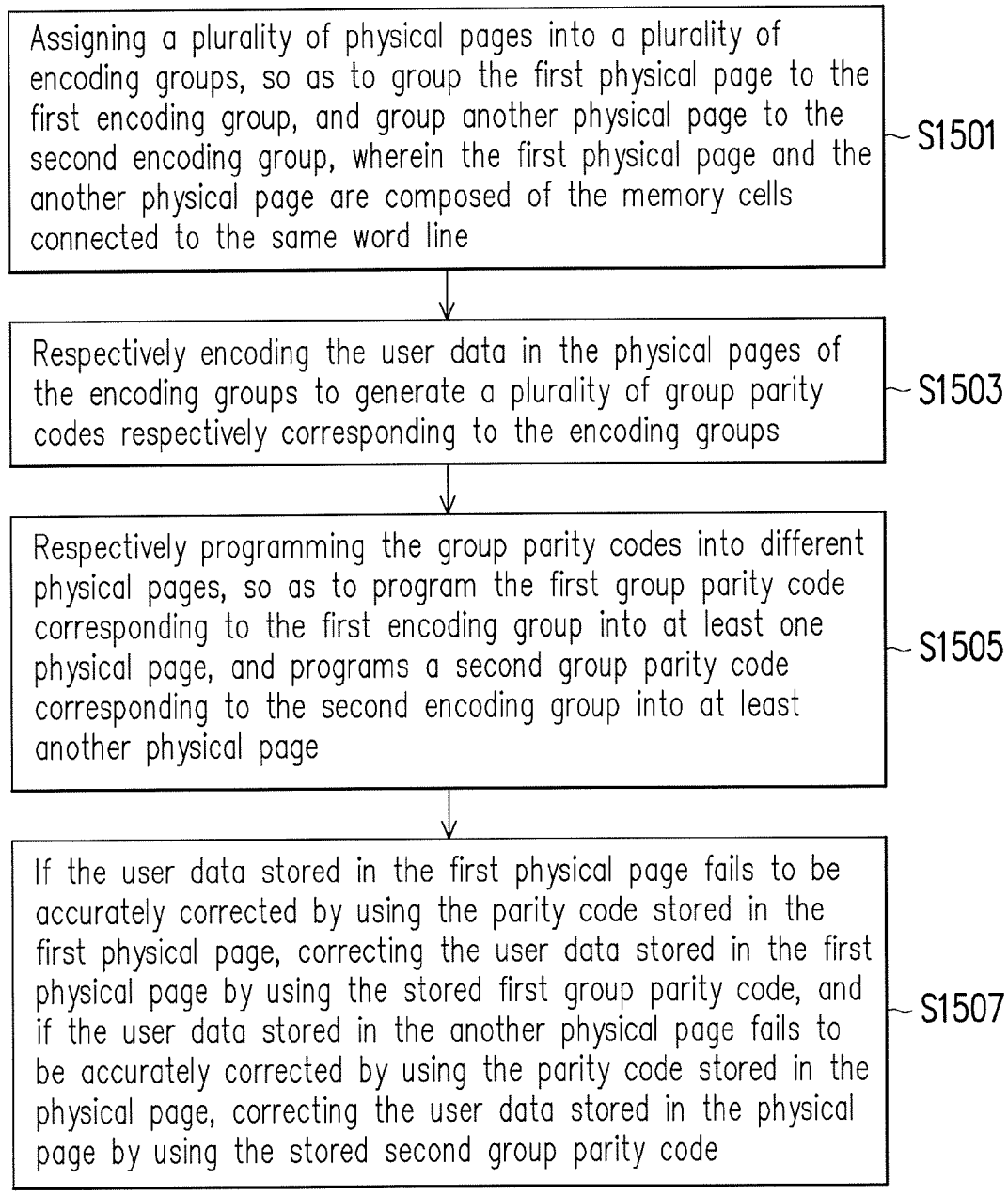
FIG. 15 is a flowchart illustrating a data protecting method according to another exemplary embodiment of the present invention.

FIG. 15 is a flowchart illustrating a data protecting method according to another exemplary embodiment.

Referring to FIG. 15, in step S1501, the memory control circuit unit 404 (or the memory management circuit 502) assigns a plurality of physical pages into a plurality of encoding groups, so as to group the first physical page to the first encoding group, and group another physical page to the second encoding group. The first physical page and the another physical page are composed of the memory cells connected to the same word line. The physical pages store user data and parity codes corresponding to the user data. It is to be mentioned that in this step, the memory control circuit unit 404 (or the memory management circuit 502) may further group different physical pages to different encoding groups according to other grouping manners. The grouping manner related to this step has been described in detail in the exemplary embodiments illustrated in FIG. 9 to FIG. 13 and will not be repeatedly described.

In step S1503, the memory control circuit unit 404 (or the memory management circuit 502) respectively encodes the user data in the physical pages of the encoding groups to generate a plurality of group parity codes respectively corresponding to the encoding groups.

In step S1505, the memory control circuit unit 404 (or the memory management circuit 502) respectively programs the group parity codes into different physical pages, so as to program the first group parity code corresponding to the first encoding group into at least one physical page, and programs a second group parity code corresponding to the second encoding group into at least another physical page.

In step S1507, if the user data stored in the first physical page fails to be accurately corrected by using the parity code stored in the first physical page, the memory control circuit unit 404 (or the memory management circuit 502) corrects the user data stored in the first physical page by using the stored first group parity code, and if the user data stored in the another physical page fails to be accurately corrected by using the parity code stored in the physical page, the memory control circuit unit 404 (or the memory management circuit 502) corrects the user data stored in the physical page by using the stored second group parity code.

Figure 16:
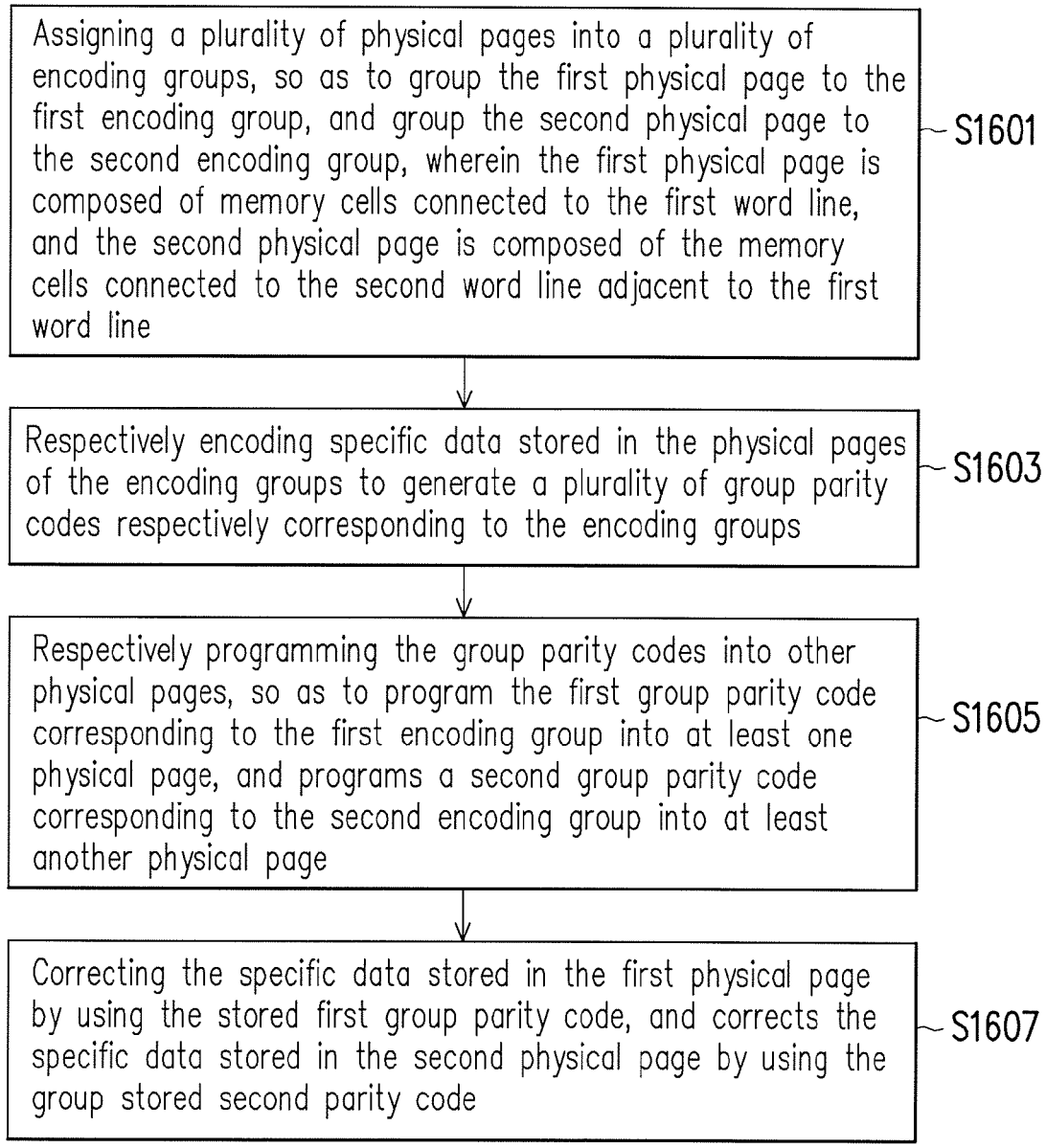
FIG. 16 is a flowchart illustrating a data protecting method according to another exemplary embodiment of the present invention.

FIG. 16 is a flowchart illustrating a data protecting method according to another exemplary embodiment.

Referring to FIG. 16, in step S1601, the memory control circuit unit 404 (or the memory management circuit 502) assigns a plurality of physical pages into a plurality of encoding groups, so as to group the first physical page to the first encoding group, and group the second physical page to the second encoding group. The first physical page is composed of memory cells connected to the first word line, and the second physical page is composed of the memory cells connected to the second word line adjacent to the first word line. It is to be mentioned that in this step, the memory control circuit unit 404 (or the memory management circuit 502) may further group different physical pages to different encoding groups according to other grouping manners. The grouping manner related to this step has been described in detail in the exemplary embodiments illustrated in FIG. 9 to FIG. 13 and will not be repeatedly described.

In step S1603, the memory control circuit unit 404 (or the memory management circuit 502) respectively encodes specific data stored in the physical pages of the encoding groups to generate a plurality of group parity codes respectively corresponding to the encoding groups. In the present exemplary embodiment, the specific data includes, for example, the user data and/or the parity codes which are stored in the physical pages.

In step S1605 the memory control circuit unit 404 (or the memory management circuit 502) respectively programs the group parity codes into other physical pages, so as to program the first group parity code corresponding to the first encoding group into at least one physical page, and programs a second group parity code corresponding to the second encoding group into at least another physical page.

In step S1607, the memory control circuit unit 404 (or the memory management circuit 502) corrects the specific data stored in the first physical page by using the stored first group parity code, and corrects the specific data stored in the second physical page by using the group stored second parity code.

Based on the above, in the present invention, the physical pages can be assigned into different encoding groups according to the word lines, the planes or the channels which the physical pages belong to, such that the encoding operation is performed according to the user data stored in the physical pages grouped to the same encoding group to generate the additional group parity codes corresponding to the encoding groups. Thereby, the encoding operation is performed on the physical pages that may be mutually affected during the programming operation. In this way, the data stored in physical pages can be performed with the error checking and correcting operation not only according to the parity code stored in each physical page, but also according to the additional group parity codes. Accordingly, the protection capability of the data stored in the physical pages ca be enhanced. The previously described exemplary embodiments of the present invention have the advantages aforementioned, wherein the advantages aforementioned not required in all versions of the invention.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A data protecting method for a rewritable non-volatile memory module, wherein the rewritable non-volatile memory module comprises a plurality of word lines, and memory cells on the same word line constitute at least one physical page, the data protecting method comprising:
   assigning a plurality of physical pages into a plurality of encoding groups, wherein the step of assigning the physical pages into the encoding groups comprises: grouping a first physical page among the physical pages to a first encoding group among the encoding groups, and grouping a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line;
   storing user data and a parity code corresponding to the user data in each of the physical pages;
   respectively encoding the user data in the physical pages of the encoding groups to generate a plurality of group parity codes respectively corresponding to the encoding groups; and
   if the user data stored in the first physical page fails to be corrected according to the parity code stored in the first physical page, correcting the user data stored in the first physical page by using the group parity code corresponding to the first encoding group.

2. The data protecting method according to claim 1, wherein the step of assigning the physical pages into the encoding groups further comprises:
   grouping a third physical page among the physical pages to a third encoding group among the encoding groups, wherein the third physical page is composed of the memory cells connected to the first word line.

3. The data protecting method according to claim 2, wherein the step of assigning the physical pages into the encoding groups further comprises:
   grouping a fourth physical page among the physical pages to a fourth encoding group among the encoding groups, wherein the fourth physical page is composed of the memory cells connected to the second word line.

4. The data protecting method according to claim 3, further comprising:
   grouping the physical pages to a plurality of super physical pages,
   wherein the rewritable non-volatile memory module is composed of a plurality of planes, the physical pages of each of the super physical pages belong to different planes, and the physical pages of each of the super physical pages are simultaneously programmed.

5. The data protecting method according to claim 4, wherein the step of assigning the physical pages into the encoding groups further comprises:
   grouping a fifth physical page among the physical pages to the second encoding group among the encoding groups, wherein the first physical page and the fifth physical page are grouped to a first super physical page among the super physical pages.

6. The data protecting method according to claim 5, wherein the step of assigning the physical pages into the encoding groups further comprises:
grouping a sixth physical page among the physical pages to the third encoding group among the encoding groups,
wherein the sixth physical page is grouped to the first super physical page.

7. The data protecting method according to claim 6, wherein the step of assigning the physical pages into the encoding groups further comprises:
grouping a seventh physical page among the physical pages to the fourth encoding group among the encoding groups,
wherein the seventh physical page is grouped to the first super physical page.

8. The data protecting method according to claim 7, wherein the rewritable non-volatile memory module further comprises a plurality of channels, and each of the planes belongs to one of the channels,
wherein the step of assigning the physical pages into the encoding groups further comprises:
grouping an eighth physical page among the physical pages to the second encoding group among the encoding groups,
wherein the eighth physical page is grouped to the first super physical page, the first physical page belongs to a first plane belonging to a first channel among the channels, and the eighth physical page belongs to a first plane belonging to a second channel among the channels.

9. The data protecting method according to claim 1, further comprising:
programming a first group parity code corresponding to the first encoding group into at least one of the physical pages, and programming a second group parity code corresponding to the second encoding group into at least another one of the physical pages.

10. A data protecting method for a rewritable non-volatile memory module, wherein the rewritable non-volatile memory module comprises a plurality of word lines, and memory cells on the same word line constitute at least two physical pages, the data protecting method comprising:
assigning a plurality of physical pages into a plurality of encoding groups, wherein the step of assigning the physical pages into the encoding groups comprises:
grouping a first physical page among the physical pages to a first encoding group among the encoding groups, grouping another physical page among the physical pages to a second encoding group among the encoding groups, wherein the first physical page and the another physical page are composed of memory cells connected to a first word line among the word lines;
storing user data and a parity code corresponding to the user data in each of the physical pages;
respectively encoding the user data in the physical pages of the encoding groups to generate a plurality of group parity codes respectively corresponding to the encoding groups; and
if the user data stored in the first physical page fails to be corrected according to the parity code stored in the first physical page, correcting the user data stored in the first physical page by using the group parity code corresponding to the first encoding group.

11. A data protecting method for a rewritable non-volatile memory module, wherein the rewritable non-volatile memory module comprises a plurality of word lines, and memory cells on the same word line constitute at least one physical page, the data protecting method comprising:
assigning a plurality of physical pages into a plurality of encoding groups, wherein the step of assigning the physical pages into the encoding groups comprises:
grouping a first physical page among the physical pages to a first encoding group among the encoding groups, and grouping a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line;
respectively encoding data in the physical pages of the encoding groups to generate a plurality of group parity codes respectively corresponding to the encoding groups; and
programming a first group parity code corresponding to the first encoding group into at least one of other physical pages, and programming a second group parity code corresponding to the second encoding group into at least another one of other physical pages among the physical pages; and
correcting the data stored in the physical pages belonging to the first encoding group by using the group parity code corresponding to the first encoding group, and correcting the data stored in the physical pages belonging to the second encoding group by using the group parity code corresponding to the second encoding group.

12. A memory storage device, comprising:
a connection interface unit configured to couple to a host system;
a rewritable non-volatile memory module comprising a plurality of word lines, wherein memory cells on the same word line constitute at least one physical page; and
a memory control circuit unit coupled to the connection interface unit and the rewritable non-volatile memory module,
wherein the memory control circuit unit assigns a plurality of physical pages into a plurality of encoding groups,
wherein in the operation of assigning the physical pages into the encoding groups, the memory control circuit unit groups a first physical page among the physical pages to a first encoding group among the encoding groups, and groups a second physical page among the physical pages to a second encoding group among the encoding groups,
wherein the first physical page is composed of memory cells connected to a first word line among the word lines, the second physical page is composed of memory cells connected to a second word line among the word lines, and the first word line is adjacent to the second word line,
wherein the memory control circuit unit stores user data and a parity code corresponding to the user data in each of the physical pages,
wherein the memory control circuit unit respectively encodes the user data in the physical pages of the encoding groups to generate a plurality of group parity codes respectively corresponding to the encoding groups, wherein if the user data stored in the first physical page fails to be corrected according to the parity code stored in the first physical page, the memory control circuit unit corrects the user data stored in the first physical page by using the group parity code corresponding to the first encoding group.

13. The memory storage device according to claim 12, wherein in the operation of assigning the physical pages into the encoding groups, the memory control circuit unit groups a third physical page among the physical pages to a third encoding group among the encoding groups, wherein the third physical page is composed of the memory cells connected to the first word line.

14. The memory storage device according to claim 13, wherein in the operation of assigning the physical pages into the encoding groups, the memory control circuit unit groups a fourth physical page among the physical pages to a first encoding group among the encoding groups, wherein the fourth physical page is composed of the memory cells connected to the second word line.

15. The memory storage device according to claim 14, wherein the memory control circuit unit groups the physical pages to a plurality of super physical pages, wherein the rewritable non-volatile memory module is composed of a plurality of planes, the physical pages of each of the super physical pages belong to different planes, and the physical pages of each of the super physical pages are simultaneously programmed.

16. The memory storage device according to claim 15, wherein in the operation of assigning the physical pages into the encoding groups, the memory control circuit unit groups a fifth physical page among the physical pages to the second encoding group among the encoding groups, wherein the first physical page and the fifth physical page are grouped to a first super physical page among the super physical pages.

17. The memory storage device according to claim 16, wherein in the operation of assigning the physical pages into the encoding groups, the memory control circuit unit groups a sixth physical page among the physical pages to the third encoding group among the encoding groups, wherein the sixth physical page is grouped to the first super physical page.

18. The memory storage device according to claim 17, wherein in the operation of assigning the seventh physical pages into the fourth encoding group among the encoding groups, the memory control circuit unit groups the seventh physical page among the physical pages to the fourth encoding group among the encoding groups, wherein the seventh physical page is grouped to the first super physical page.

19. The memory storage device according to claim 18, wherein the rewritable non-volatile memory module further comprises a plurality of channels, and each of the planes belongs to one of the channels, wherein in the operation of assigning the physical pages into the encoding groups, the memory control circuit unit groups an eighth physical page among the physical pages to the second encoding group among the encoding groups, wherein the eighth physical page is grouped to the first super physical page, the first physical page belongs to a first plane of a first channel among the channels, and the eighth physical page belongs to a first plane of a second channel among.

20. The memory storage device according to claim 12, wherein the memory control circuit unit programs a first group parity code corresponding to the first encoding group into at least one of the physical pages, and programs a second group parity code corresponding to the second encoding group into at least another physical page.

21. A memory control circuit unit for controlling a rewritable non-volatile memory module, wherein the rewritable non-volatile memory module comprises a plurality of word lines, and memory cells on the same word line constitute at least one physical page, the memory control circuit unit comprising:

a host interface configured to couple to a host system;

a memory interface configured to couple to the rewritable non-volatile memory module;

an error checking and correcting circuit; and a memory management circuit coupled to the host interface, the error checking and correcting circuit and the memory interface, wherein the memory management circuit assigns a plurality of physical pages into a plurality of encoding groups, wherein in the operation of assigning the physical pages into the encoding groups, the memory management circuit groups a first physical page among the physical pages to a first encoding group among the encoding groups, and groups a second physical page among the physical pages to a second encoding group among the encoding groups, wherein the first physical page is composed of memory cells connected to a first word line among the word lines, the second physical page is composed of memory cells connected to a second word line among the word lines, and the first word line is adjacent to the second word line, wherein the memory management circuit stores user data and a parity code corresponding to the user data in each of the physical pages, wherein the error checking and correcting circuit respectively encodes the user data in the physical pages of the encoding groups to generate a plurality of group parity codes respectively corresponding to the encoding groups, wherein if the user data stored in the first physical page fails to be corrected according to the parity code stored in the first physical page, the error checking and correcting circuit corrects the user data stored in the first physical page by using the group parity code corresponding to the first encoding group.

22. The memory control circuit unit according to claim 21, wherein in the operation of assigning the physical pages into the encoding groups, the memory management circuit groups a third physical page among the physical pages to a third encoding group among the encoding groups, wherein the third physical page is composed of the memory cells connected to the first word line.

23. The memory control circuit unit according to claim 22, wherein in the operation of assigning the physical pages into the encoding groups, the memory management circuit groups a fourth physical page among the physical pages to a fourth encoding group among the encoding groups, wherein the fourth physical page is composed of the memory cells connected to the second word line.

24. The memory control circuit unit according to claim 23, wherein the memory management circuit groups the physical pages to a plurality of super physical pages,
wherein the rewritable non-volatile memory module is composed of a plurality of planes, the physical pages of each of the super physical pages belong to different planes, and the physical pages of each of the super physical pages are simultaneously programmed.

25. The memory control circuit unit according to claim 24, wherein in the operation of assigning the physical pages into the encoding groups, the memory management circuit groups a fifth physical page among the physical pages to the second encoding group among the encoding groups,
wherein the first physical page and the fifth physical page are grouped to a first super physical page among the super physical pages.

26. The memory control circuit unit according to claim 25, wherein in the operation of assigning the physical pages into the encoding groups, the memory management circuit groups a sixth physical page among the physical pages to the third encoding group among the encoding groups,
wherein the sixth physical page is grouped to the first super physical page.

27. The memory control circuit unit according to claim 26, wherein in the operation of assigning the physical pages into the encoding groups, the memory management circuit groups a seventh physical page among the physical pages to the fourth encoding group among the encoding groups,
wherein the seventh physical page is grouped to the first super physical page.

28. The memory control circuit unit according to claim 27, wherein the rewritable non-volatile memory module further comprises a plurality of channels, and each of the planes belongs to one of the channels,
wherein in the operation of assigning the physical pages into the encoding groups, the memory management circuit groups an eighth physical page among the physical pages to the second encoding group among the encoding groups,
wherein the eighth physical page is grouped to the first super physical page, the first physical page belongs to a first plane of a first channel among the channels, and the eighth physical page belongs to a first plane of a second channel among the channels.

29. The memory control circuit unit according to claim 21, wherein the memory management circuit programs a first group parity code corresponding to the first encoding group into at least one of the physical pages, and programs a second group parity code corresponding to the second encoding group into at least another one of the physical pages.

* * * * *